United States Patent [19]

Takeuchi et al.

[11] Patent Number: 5,583,446

[45] Date of Patent: Dec. 10, 1996

[54] ELECTRO-OPTICALLY CONTROLLED MEASUREMENT PROBE SYSTEM

[75] Inventors: Koichiro Takeuchi, Akishima; Yukio Kasahara, Machida; Akira Miura, Akishima; Hideto Iwaoka, Hachioji; Tadashi Sugiyama, Mitaka, all of Japan

[73] Assignee: Teratec Corporation, Tokyo, Japan

[21] Appl. No.: 351,396

[22] PCT Filed: Apr. 12, 1994

[86] PCT No.: PCT/JP94/00611

§ 371 Date: Feb. 14, 1995

§ 102(e) Date: Feb. 14, 1995

[87] PCT Pub. No.: WO94/24575

PCT Pub. Date: Oct. 27, 1994

[30] Foreign Application Priority Data

| Apr. 13, 1993 | [JP] | Japan | 5-086439 |
| Jul. 20, 1993 | [JP] | Japan | 5-179307 |
| Jul. 20, 1993 | [JP] | Japan | 5-179320 |
| Jul. 20, 1993 | [JP] | Japan | 5-179326 |
| Jul. 22, 1993 | [JP] | Japan | 5-181687 |

[51] Int. Cl.⁶ ............................. G01R 31/02; G01R 1/067
[52] U.S. Cl. ................................... 324/754; 324/758
[58] Field of Search ........................... 250/306, 307; 324/754, 757, 758, 96

[56] References Cited

U.S. PATENT DOCUMENTS

| 4,603,293 | 7/1986 | Mourou et al. | |
| 4,851,767 | 7/1989 | Halbout et al. | |
| 4,918,309 | 4/1990 | Beha et al. | 250/306 |
| 5,198,667 | 3/1993 | Glembocki et al. | 250/306 |
| 5,260,567 | 11/1993 | Kuroda et al. | 250/306 |
| 5,331,275 | 7/1994 | Ozaki et al. | 324/757 |

FOREIGN PATENT DOCUMENTS

| 60-73366 | 4/1985 | Japan. |
| 60-253878 | 12/1985 | Japan. |
| 63-133068 | 6/1988 | Japan. |
| 63-259446 | 10/1988 | Japan. |
| 1182767 | 7/1989 | Japan. |
| 2172250 | 7/1990 | Japan. |

Primary Examiner—Ernest F. Karlsen
Assistant Examiner—Russell M. Kobert
Attorney, Agent, or Firm—Cushman, Darby & Cushman

[57] ABSTRACT

A needle-shaped terminal, i.e., a probe tip, is brought into extremely close proximity with an object being measured. This probe tip is formed from an optically active material and in itself is electrically non-conductive, so that it has no electrical influence whatsoever on the object being measured. When optical pulses are beamed onto this probe tip, the probe tip becomes an electric conductor and a current flows between it and the object being measured, so that the electric potential of the object can be measured. This facilitates previously impossible measurements of high-speed electric waveforms. It also facilitates high spatial resolution monitoring and control of probe tip position and characterization of measurement sites, and enables highly reliable measurements to be made inexpensively.

12 Claims, 24 Drawing Sheets

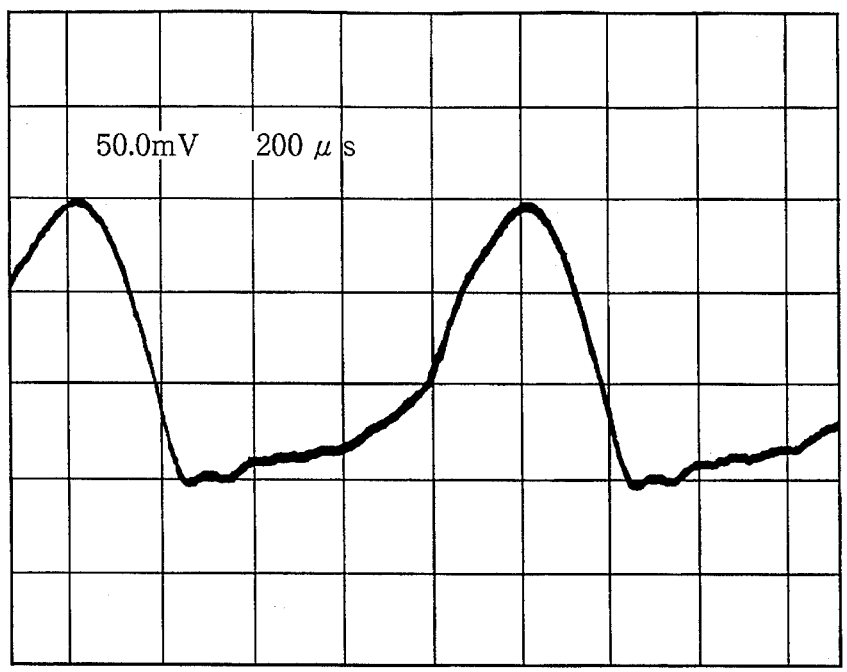
200 μs/div.
Fig.11
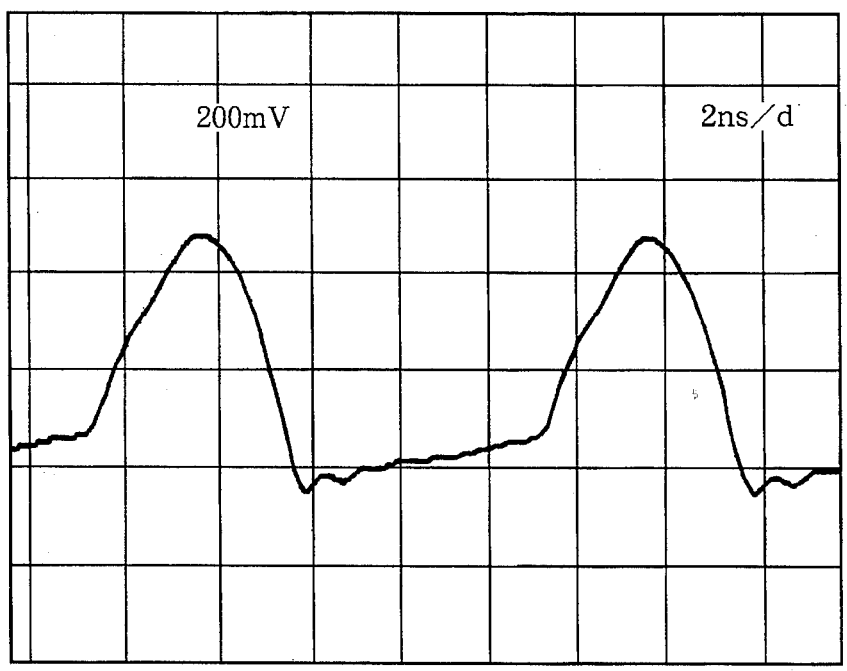
Fig.12   2ns/div.
PRIOR ART

ELECTRO-OPTICALLY CONTROLLED MEASUREMENT PROBE SYSTEM

TECHNICAL FIELD

This invention is utilized for semiconductor research and manufacture, and it relates in particular to techniques for measuring the operating state of high-speed integrated electronic circuits. It is utilized for the observation and measurement of extremely small, precise structures, and as a precision measuring instrument capable of measuring the electrical characteristics of electric circuits on which extremely minute mechanical structures have been formed, and where the spacing between adjacent circuits is extremely small. This invention is suited for utilization in semiconductor device manufacture and research, and it has been developed in order to make electrical measurements of the operating state of high-speed integrated electronic circuits.

BACKGROUND TECHNOLOGY

The frequency of the signals that are dealt with in the field of electronics has recently reached 250 GHz, and the current status of high-speed electrical measuring technology is that the methods employed to observe these high-speed electric waveforms have not kept up with technical progress. Furthermore, advances in the miniaturization of circuit elements have led to a situation in which neither the temporal resolution nor the spatial resolution of electric measuring instruments has kept up with current technical progress.

An established and representative means of observing high-speed phenomena such as the high-speed operating state of microcircuit elements is the sampling oscilloscope. In addition, studies have recently been made of EO sampling, a technique which utilizes the electro-optic effect in electro-optic crystals (see Kamiya, T. and Takahashi, M., "Electro-optic sampling using semiconductor lasers," *Oyo Butsuri*, Vol. 61, No. 1, p. 30, 1992; and Nagatsuma, T., "Measurement of high-speed devices and integrated circuits using electro-optic sampling technique," *IEICE Trans. Electron.*, Vol.E-76C, No. 1, January 1993). Given that it has become comparatively easy in the field of laser technology to obtain optical pulses in the subpicosecond range, optical sampling techniques seek to use such laser pulses for sampling electric signals. These techniques are faster than conventional electronic measurements, and can provide direct, non-contact measurements of electric potential at a desired point on a circuit under test, without leading out the signal. In other words, with this technique the electric pulses used for sampling in a sampling oscilloscope are replaced with optical pulses.

Another method for making high spatial resolution direct measurements of electric potential at a desired point is the electron-beam tester (see Plows, G., "Electron-beam probing," Semiconductors and Semimetals, Vol. 28 (*Measurement of high-speed signals in solid-state devices*), Chap. 6, p. 336, Ed. Willardson, R. K. and Beer, Albert C., Academic Press, 1990). Electron-beam testers are a powerful means of observing electric signals inside ICs for diagnosis and analysis of IC operation.

Scanning tunnelling microscopes and atomic force microscopes are among the devices which have recently undergone rapid development and come into widespread use as instruments for making high spatial resolution observations of the surface shape of objects under test. Because these devices are able to provide three-dimensional images at ultra-high spatial resolutions corresponding to the atomic scale, they are very well suited to the observation of the surface shape of semiconductor integrated circuits and the like. Bloom et al. have recently proposed a method for measuring the electric potential of an object under test using an atomic force microscope (AFM) (see Hou, A. S., Ho, F. and Bloom, D. M., "Picosecond electrical sampling using a scanning force microscope," *Electronics Letters*, Vol. 28, No. 25, p. 2302, 1992). In this method, a high-speed electronic circuit is used as the object being measured by an ordinary AFM, and a repulsive or attractive force is produced between the AFM probe and this object in accordance with the electric potential at the point being measured. This force gives rise to a minute displacement of the probe position. The method proposed by Bloom et al. involves detecting these minute displacements in order to measure changes with time in the electric potential at the point being measured.

However, the temporal resolution of a sampling oscilloscope is limited by the speed at which measurements can be carried out. This is dependent on a time constant which is determined by the width of the electric pulses used for sampling and by the resistance and capacitance of the measuring system. Moreover, because the signal being measured is led out from the measurement point via a cable or waveguide, it ends up being disturbed, with the result that there are problems regarding its reliability as well.

In the EO sampling technique, it is difficult to measure the absolute value of the signal, and there are practical problems relating to, among other things, the methods employed to provide high spatial resolution monitoring and control of probe position.

Electron-beam testers have a low temporal resolution and cannot be applied to the evaluation of ICs that use high-speed transistors. They also have the inconvenience of requiring a high vacuum as the measurement environment.

The temporal resolution of scanning tunnelling microscopes and atomic force microscopes has a limit that is set by the response speed of the probe, which is a mechanical system, and it is therefore difficult to use these devices for the measurement of high-speed electric waveforms.

Accordingly, a new means of measurement is required for the accurate evaluation of electric waveforms in large-scale integrated electronic circuits.

This situation may be looked at from another point of view as well. Namely, in prior art devices, only the pursuit of sampling speed has been regarded as important, and hardly any consideration has been given to positional control. The prior art will be explained with reference to FIG. 35, which is a block diagram of a prior art device. Object being measured 1 lies on testing stage 133, and the part of the object that is to be measured is set, by the operation of testing stage position controller 132, in the vicinity of probe tip 51, which is supported by probe arm 21. Next, after probe tip 51 has been brought into contact with object being measured 1, adjustment in the height direction is carried out by vertical position controller 130 which is formed from a piezoelectric element or the like, and the optimum measurement position is determined. Light is beamed onto probe tip 51 from light source 92. If an electric potential is present at the measurement site on object 1, the refractive index of the electro-optic crystal will change due to the electro-optic effect, whereupon the direction of polarization of the light reflected back from probe tip 51 will change from the direction it would have had if no electric potential had been present. The amount of change is detected by an optical system comprising wave plate 99, polarizer 97 and photodetector element 11, and is input to electric measuring instrument 60, which results in a measurement of the electric potential at the site being measured.

Prior art devices of this kind have the following problems. Namely, when the object being measured is an integrated circuit or the like where the thickness varies from place to place, every time the measurement site is changed it will be necessary to repeat the operations of bringing probe tip 51 into contact and positioning it, with the result that (1) measurements take a long time, and (2) the large mass of the part that holds probe tip 51 means that there is a strong chance of physically damaging the circuits of the object being measured.

Thus, in prior art devices, only the pursuit of sampling speed has been regarded as important, and hardly any consideration has been given to positional control.

The present invention has been devised in the light of this situation and meets the need for high temporal and spatial resolution measurement of high-speed electric waveforms at any measurement point on or in an integrated circuit. It is applicable to faster and more minute objects of measurement, and its purpose is to provide a more reliable high-speed electric measuring instrument and probe for the instrument, and an atomic force microscope which will serve as a high-speed electric measuring method and measuring instrument.

A further purpose of this invention is to provide an electro-optic measuring instrument which can perform high-precision position control.

DISCLOSURE OF THE INVENTION

This invention provides an electric measuring instrument which has a probe means that is brought into close proximity with an electronic device being measured, and a means which measures electric current by way of this probe means; the electric measuring instrument being characterized in that at least part of the probe means comprises an optically active material, and in that there is provided a means which beams pulses of light through this optically active material, the pulses of light altering the conductive state of the material. The aforementioned optically active material should be in a non-conductive state in the measurement environment, and may be a group IV, group III–V or group II–VI semiconductor.

In this specification, the aforementioned means which measures electric current may be construed as being a means which measures electric potential. Because this invention is aimed at application to electronic devices, current is measured in order to measure potential. Furthermore, in this specification, the terms "probe means" or "probe" indicate a detecting part comprising a probe tip that is in close proximity to the object being measured, and an arm which supports this probe tip.

In order to make ultrahigh-speed, ultrahigh spatial resolution measurements of changes with time in the electric field of an object under test, light in the form of short pulses is beamed at the object and at the probe tip positioned in its vicinity, the probe tip being a needle-shaped terminal, whereupon an electric current will be produced. This current will flow only when light is irradiating the probe tip, and will depend on the voltage between the test object and the probe tip. By measuring this current, the electric potential of the object under test can be sampled. In other words, although the probe tip is brought extremely close to the object under test, by itself it is electrically non-conductive, and so the resistance and capacitance, etc., of the measuring system have no electrical influence whatsoever on the test object. However, when an optical pulse irradiates this probe tip formed of an optically active material, the probe tip becomes a conductor and a current will flow between it and the object under test, with the result that the electric potential of said object can be measured.

It does not matter whether the probe tip and the object under test are kept apart at a distance of the order of atoms, or are brought into contact. If they are apart, the current will flow by means of the tunnel effect or field emission. If they are in contact and a barrier has formed at their interface, current will flow as a result of tunnelling, while if a barrier has not formed, an ordinary current will flow. Even if there is contact, the influence on the object under test can be made satisfactorily small if the resistance presented by the probe current path is sufficiently large and the capacitance of the optically active region when non-conductive is sufficiently small. In this case, the size of the detected current will be determined by this resistance value, and will be proportional to the electric potential of the object under test.

A high-speed electric measuring instrument constituted in this manner facilitates previously impossible measurements of high-speed electric waveforms. It also facilitates high spatial resolution monitoring and control of probe tip position and characterization of measurement sites, and enables high reliability measurements to be made inexpensively.

It is desirable for the aforementioned probe means to comprise a probe tip, and for part or all of this probe tip to be an optically active material.

It is also feasible for the aforementioned probe means to be provided with a probe tip made of an electrically conductive material, and for the optically active material to be interposed in the electrical path which connects the probe tip made of this conductive material to the aforementioned measuring means.

It is also feasible to provide a synchronization circuit which synchronizes the aforementioned means which produces optical pulses and the operation of the aforementioned electronic device being measured.

The aforementioned optical pulses may be periodic optical pulses.

This invention also provides a probe which has a probe tip that is brought into close proximity with an electronic device under test, the probe transmitting, to an electric measuring instrument, the electric potential at the point with which the probe tip is in close proximity; and the probe is characterized in that an optically active material is interposed in the electrical path from the aforementioned probe tip to the aforementioned electric measuring instrument, and in that it has a means which introduces light into this optically active material, the light activating this material to an electrically conductive state. It is desirable for at least part of the aforementioned probe tip to be formed from an optically active material.

An arm which mechanically holds the aforementioned probe tip may also be provided, and the aforementioned means which introduces light may comprise an optical waveguide provided along this arm.

It is also feasible for the aforementioned optical waveguide to be an optical fiber, for a metal coating to be applied to this optical fiber, and for this metal coating to form part of the aforementioned electrical path.

The aforementioned probe tip may be formed from a conductive material, and the mounting structure which fixes this probe tip to the mechanically holding arm may comprise an optically active material. An optical waveguide may be provided along this arm.

This invention can also provide an atomic force microscope equipped with the aforementioned probe. It is desirable for this atomic force microscope to have, as a means for positioning the probe relative to the electronic device being measured, a means for irradiating the probe with light and a means for detecting light reflected by the probe. The light which activates the optically active material to an electrically conductive state may be light emitted from the same light source that produces the light used by this positioning means.

This invention also provides a semiconductor integrated circuit which has a measuring electrode that is connected to an electric measuring instrument, the semiconductor integrated circuit being characterized in that the element being measured and the aforementioned measuring electrode are connected by an optically active material, and in that this optically active material is in a non-conductive state in the measurement environment, and in that it becomes conductive when irradiated by light.

Because it has become comparatively easy in the field of laser technology to obtain optical pulses in the subpicosecond range, such laser pulses are used for sampling electric signals. This enables direct measurements to be made of electric potential at a point of interest, and such measurements are faster than conventional electronic measurements and do not involve leading out the signal. In other words, this technique replaces the electric pulses used for sampling in a sampling oscilloscope with optical pulses.

As regards position control of the probe, minute displacements of probe position can be expressed as displacements in the position of the beam of light which is reflected after striking the probe. A photodetector element detects the position of the probe by detecting the displacement of the position at which this reflected light strikes. The position of the probe is displaced in accordance with irregularities of the surface of the object being measured.

The position of the probe relative to an integrated circuit or other object under test which has irregularities, can be controlled with great precision by comparing the irregularities that the probe is scanning with irregularities that are already known. In this way, an electro-optic measuring instrument capable of high-precision position control can be achieved by means of a simple constitution.

Embodiments of this invention will now be explained with reference to the drawings.

BRIEF EXPLANATION OF THE DRAWINGS

FIG. 11 gives measurement results obtained with a device according to the first embodiment of this invention.

FIG. 12 shows the characteristics of an electronic device being measured by conventional equipment.

OPTIMUM CONFIGURATIONS FOR EMBODYING THIS INVENTION

Figure 1A:
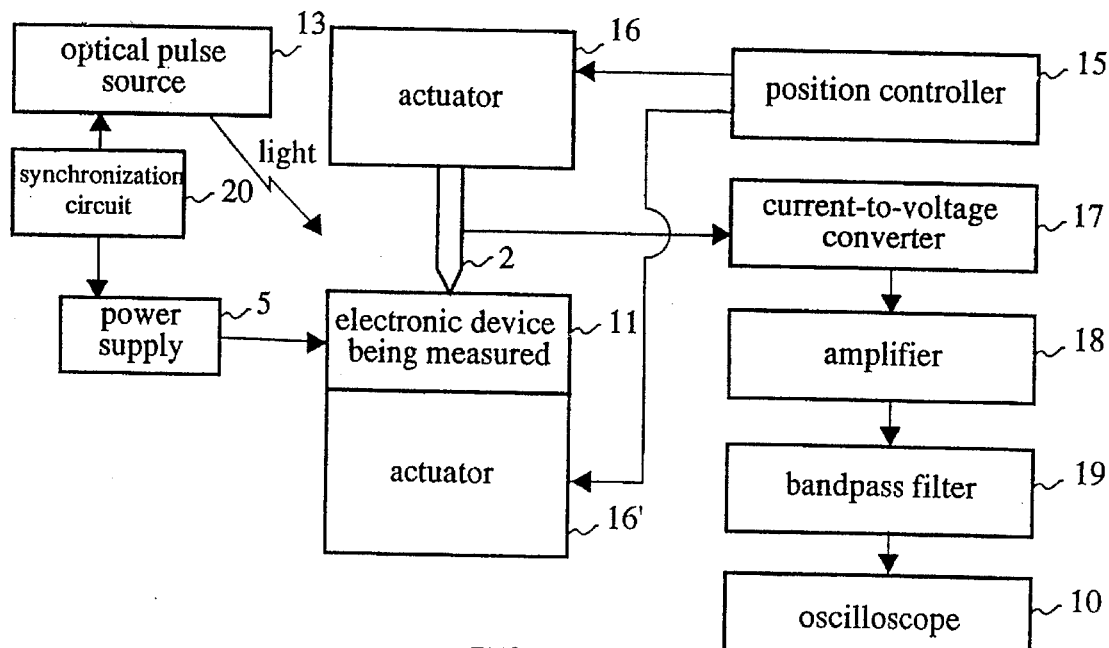
FIGS. 1a and 1b are block diagrams of a device according to a first embodiment of this invention.

The constitution of a device according to a first embodiment of this invention will be explained with reference to FIGS. 1a and 1b, which are block diagram of the device.

This device is an electric measuring instrument and is provided with probe 2 which is brought into close proximity with electronic device being measured 11. It is also provided with current-to-voltage converter 17, amplifier 18, bandpass filter 19 and oscilloscope 10, which together serve as a means for measuring the current flowing in probe 2.

The distinguishing features of this device are that probe 2 comprises an optically active material, and that optical pulse source 13 is provided as a means for irradiating probe 2 with intense pulses of light which make the aforementioned optically active material conductive. This optically active material may be a group IV, group III–V or group II–VI semiconductor. In a device according to this first embodiment of the invention, the whole of probe 2 is an optically active material. It was previously stated that in this specification, the term "probe" would indicate a detecting part comprising a probe tip which is in close proximity with the object being measured, and an arm which supports this probe tip. However, probe 2 in this first embodiment of the invention should be interpreted as a probe consisting entirely of a probe tip.

The aforementioned pulses of light are periodic optical pulses. In FIG. 1a, optical pulse source 13 and power supply 5 are synchronized by synchronization circuit 20, while in FIG. 1b there is a means which synchronizes the measurement timing of oscilloscope 10 with optical pulse source 13.

Probe 2 is set up on actuator 16, and the electronic device being measured 11 is set up on actuator 16'. The distance between these two actuators 16 and 16' is controlled to a preset value by position controller 15.

Figure 2:
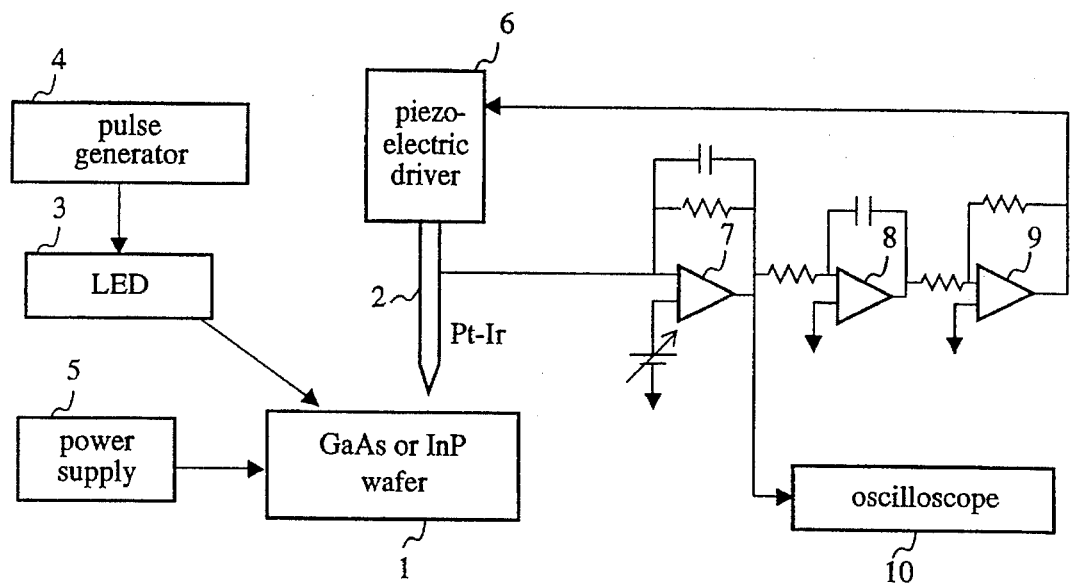
FIG. 2 shows an experimental arrangement of this first embodiment.
Figure 3:
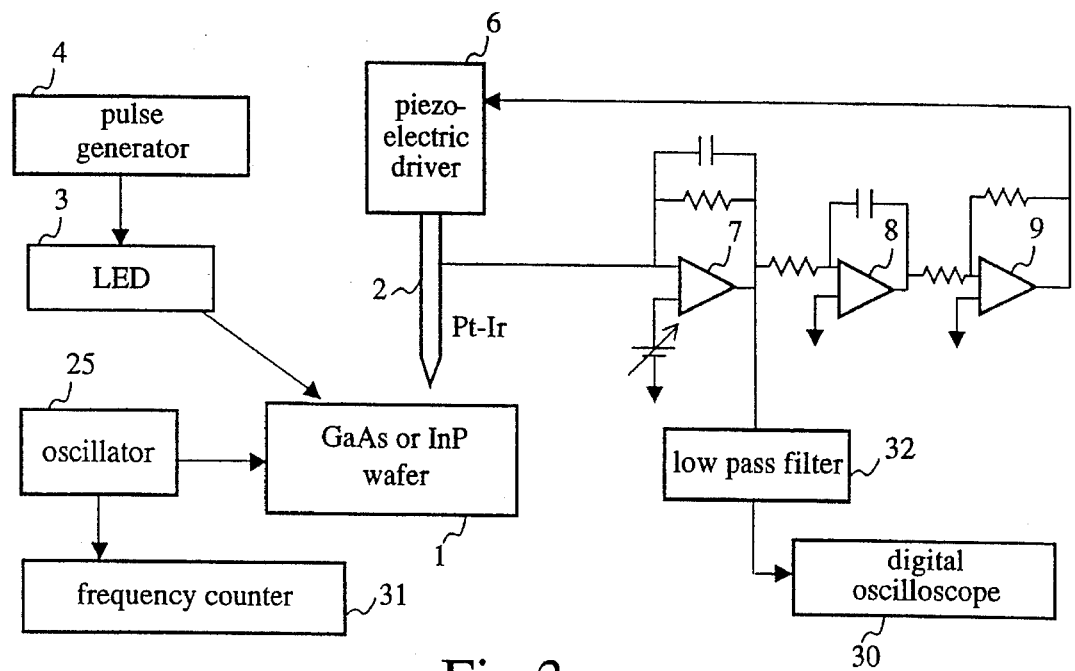
FIG. 3 shows an experimental arrangement of this first embodiment.
Figure 4A:
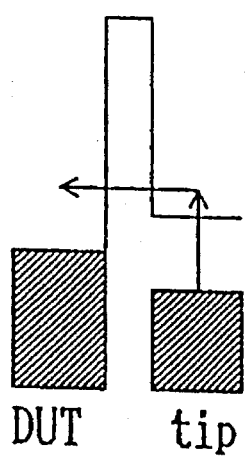
FIGS. 4a to 4c illustrate the measurement principles.
Figure 4B:
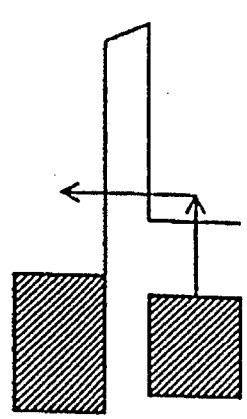
Figure 4C:
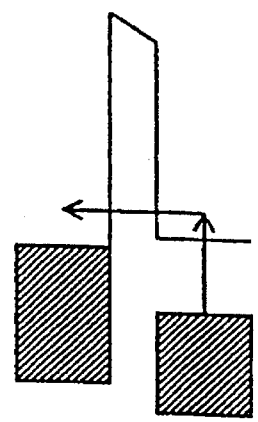

Next, the operation of this first embodiment of the invention will be explained with reference to FIG. 2–FIG. 10. FIG. 2 and FIG. 3 show experimental arrangements of this first embodiment. FIGS. 4a to 4c show the measurement principles involved. FIG. 5–FIG. 10 show experimental results, with time plotted along the horizontal axis and voltage along the vertical axis. Experiments based on this first embodiment were conducted in air using the two experimental arrangements illustrated in FIG. 2 and FIG. 3. In these experiments, for the sake of convenience, the object being measured 1 was formed of an optically active material, and a platinum-iridium alloy (hereinafter, written as "Pt-Ir") was used as probe 2. Electric potential was measured by activating the optically active material by beaming light in the vicinity of the probe tip located at the end of probe 2. In this way, equivalent measurements could be made of the operating characteristics of a device according to this first embodiment.

The object test 1 in this first embodiment was a wafer of semi-insulating type gallium arsenide (hereinafter, written as "GaAs") or indium phosphide (hereinafter, written as "InP"). An electrode was made by sputtering gold (Au) onto the surface of the wafer, and a lead wire was attached by means of a conductive adhesive (silver paste). To prevent oxidation and/or contamination of the surface of object under test 1, the water was cleaved immediately prior to measurement and the resulting cleaved surface used as the test object. Pulses of light from an aluminium gallium arsenide (hereinafter, written as "AlGaAs") LED emitting at a wavelength of 650 nm were used as the light source. LED 3 was impedance-matched to 50Ω, and its response time to the input voltage was 45 ns.

The experiment illustrated in FIG. 2 will be explained first of all. Test object 1 comprising a semiconductor wafer (GaAs or InP) and probe 2 are set tip in air and separated by a minute distance. LED 3 is driven by pulse generator 4, and the vicinity of the tip of probe 2 over test object 1 is irradiated with light. A DC bias voltage is applied to object under test 1 by means of power supply 5.

Probe 2 is driven by piezoelectric driver 6, and microposition control of the probe is carried out by using a feedback circuit comprising preamplifier 7 and operational amplifiers 8 and 9 to detect the tunnel current flowing between probe 2 and object under test 1. This constitutes the same control system as in a scanning tunnelling microscope.

The time constant of the feedback circuit as a whole is designed so as to be larger than the time constant of the pulse signal from pulse generator 4. However, preamplifier 7 operates fast enough for the aforementioned pulse signal to be fully observable by means of oscilloscope 10 connected to its output.

Next, the experiment illustrated in FIG. 3 will be explained. FIG. 3 shows an experimental arrangement where, instead of applying a DC voltage to object under test 1, as in FIG. 2, an alternating electric field was applied.

In FIG. 3, test object 1 and probe 2 are set up as in FIG. 2, i.e., in air and separated by a minute distance. LED 3 is driven by pulse generator 4 and the vicinity of the tip of probe 2 over object under test 1 is irradiated with light.

Object under test 1 is driven by oscillator 25, and frequency counter 31 can be used to observe the repetition rates of pulse generator 4 and oscillator 25, and their difference in frequency Δf.

Probe 2 is driven by piezoelectric driver 6, and microposition control of the probe is carried out by using a feedback circuit comprising preamplifier 7 and operational amplifiers 8 and 9 to detect the tunnel current that flows between probe 2 and object under test 1. The time constant of this control system is made the same as in the experiment illustrated in FIG. 2.

The output signal from preamplifier 7 can be observed by means of digital oscilloscope 30 via low-pass filter 32. Oscillator 25 is constituted so that a DC voltage can be applied as an offset.

With this experimental arrangement, a measuring instrument comprising probe 2 is set up in contact with or at a minute distance of the order of atoms (5–10 Å) from object under test 1. This measuring instrument is irradiated with light in the form of short pulses in the vicinity of the region where test object 1 and probe 2 are opposed, which results in an electric current being produced and flowing between test object 1 and probe 2. The electric potential of object under test 1 can be sampled by measuring this current, and in this way it is possible to make measurements of the operating condition and electric field distribution, etc., of the object under test.

The measurement principles will be explained with reference to FIGS. 4a to 4c. It is assumed that when VD, the potential of the sample device under test (DUT), equals Vt, the potential of the needle-shaped terminal that serves as the probe tip (see FIG. 4a), the Fermi level of the sample DUT coincides with the center of the forbidden band of the probe tip. Under these circumstances, because there will usually be few carriers, no tunnel current will flow, nor will field emission occur. In this state, if the probe tip is irradiated with light, carriers will be created and a tunnel current will flow, but only while light is striking. Depending on the shape of the tunnelling barrier and on other factors, a current may also flow due to field emission. The size of this current will depend on the potential difference between the object being measured and the probe tip, i.e., on VD-Vt (see FIG. 4b and 4c). It follows that the potential of the sample DUT can be found by setting Vt appropriately and observing the resulting current.

Utilizing this basic measurement principle, a sampling mode of operation can be performed by setting the repetition rate of the short laser pulses comprising the irradiating light to a frequency which is very slightly shifted from the frequency of the electric signal in test object 1, and measuring the current that flows under these circumstances. In this case, the electric signal in test object 1 can easily be measured by an ordinary measuring instrument such as digital oscilloscope 30, as a signal with a frequency equal to the difference in frequency between the repetition rate of the above-mentioned optical pulses and the electric signal: in other words, as a beat component.

An effective way of maintaining the position of the probe tip is to employ the same sort of means as used in a scanning tunnelling microscope (STM) to provide feedback for keeping the average current constant. By making the frequency range of this feedback control system sufficiently narrow and ensuring that (a) the frequency of the electric signal of test object 1, (b) the repetition rate of the optical pulses, and (c) the resulting beat frequency, are all set sufficiently higher than this frequency range of the feedback control system, the electric signal of test object 1 can be measured while maintaining the position of the probe tip.

Another effective way of maintaining the position of the probe tip is to employ the technique generally used in an atomic force microscope (AFM): namely, to detect the interatomic force acting between object being measured 1 and the probe tip as a deviation in the position of the probe tip, and to provide feedback for keeping this constant.

It is also feasible to make high-precision measurements of potentials on object under test 1 by applying bias voltages respectively to test object 1 and/or the probe tip, and adjusting the respective bias currents. Under these circumstances, silicon or other group IV semiconductor, gallium arsenide or other group III–V semiconductor, zinc selenide or other group II–VI semiconductor, etc., can be used as the above-mentioned probe tip made of a semiconductor.

The response of the system to optical pulses was confirmed by means of the experimental arrangement shown in FIG. 2. The experimental method employed and the results obtained will now be explained. Referring to FIG. 2, pulse generator 4 was used to output square pulses of light from LED 3 while a DC bias was being applied to object under test 1 by means of power supply 5. These optical pulses irradiated the cleaved surface of object under test 1, and oscilloscope 10 was used to measure the resulting output of preamplifier 7, thereby providing observations of the response of the tunnel current produced between test object 1 and probe 2 to the pulses of light. The potential of probe 2 was 0 V, and the average tunnel current under these circumstances was controlled by the aforementioned feedback circuit to a value of 1 nA.

Preamplifier 7 converts a 1 nA tunnel current to a voltage of 10 mV, and its frequency range is of the order of 400 kHz. On the other hand, the frequency range of a scanning tunnelling microscope control system is determined by the time constant of the integrating circuit, and in this first embodiment of the invention is set at 300 Hz. A signal in the frequency region between these two, i.e, in approximately the 1–400 kHz range, can therefore be applied and detected without disturbing the operation of the feedback control system.

Figure 5:
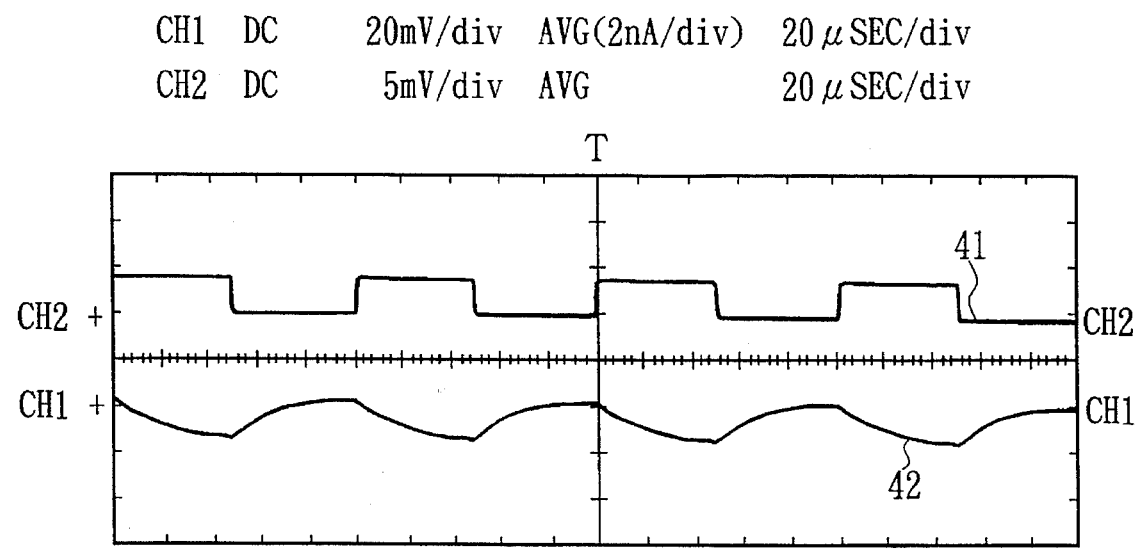
FIG. 5 gives experimental ressults obtained with the first embodiment.
Figure 6:
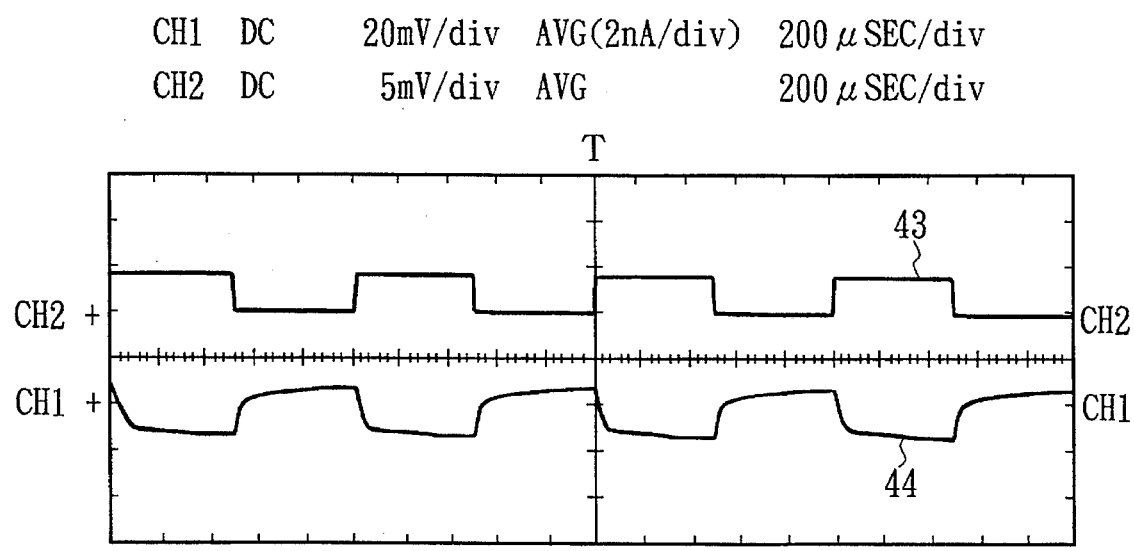
FIG. 6 gives experimental results obtained with the first embodiment.

Various experimental results will now be given. It may be noted that for convenience, the following measurements were carried out with probe 2 and object under test 1 transposed, with a platinum iridium alloy (hereinafter, written as "Pt-Ir") used as probe 2 and GaAs or InP used as object under test 1. The results obtained (at a frequency of 10 kHz) using semi-insulating type InP as test object 1 are shown in FIG. 5, while the results obtained (at a frequency of 1 kHz) using semi-insulating type GaAs are shown in FIG. 6. Square waves 41 and 43 in FIG. 5 and FIG. 6 are the driving voltage of LED 3, while rounded waveforms 42 and 44 are the tunnel currents. The fact that tunnel current waveforms 42 and 44 are not perfect square waves but are rounded is due to preamplifier 7 having a narrow pass band, and to its time constant being approximately 10 µs. This value corresponds closely to the time constant obtained from these waveforms.

Because the sign of the tunnel current is inverted, the downturned portions correspond to times when a current is flowing. Due to there being an extra offset in preamplifier 7, the origin of the current appears shifted downwards, but the tunnel current varies between 0 nA and 2 nA, centering on the average tunnel current of 1 nA, which is plausible behaviour.

The results shown here are for the case where the bias voltage applied by power supply 5 is +2 V DC. Different bias voltages between −5 V and +5 V were tested, and in every case a similar result was obtained: namely, that current flowed only while light was striking the measurement site. This sort of response of the tunnel current to light was also observed when the bias voltage was much smaller than the bandgap of object being measured 1, at practically 0 V.

Figure 7:
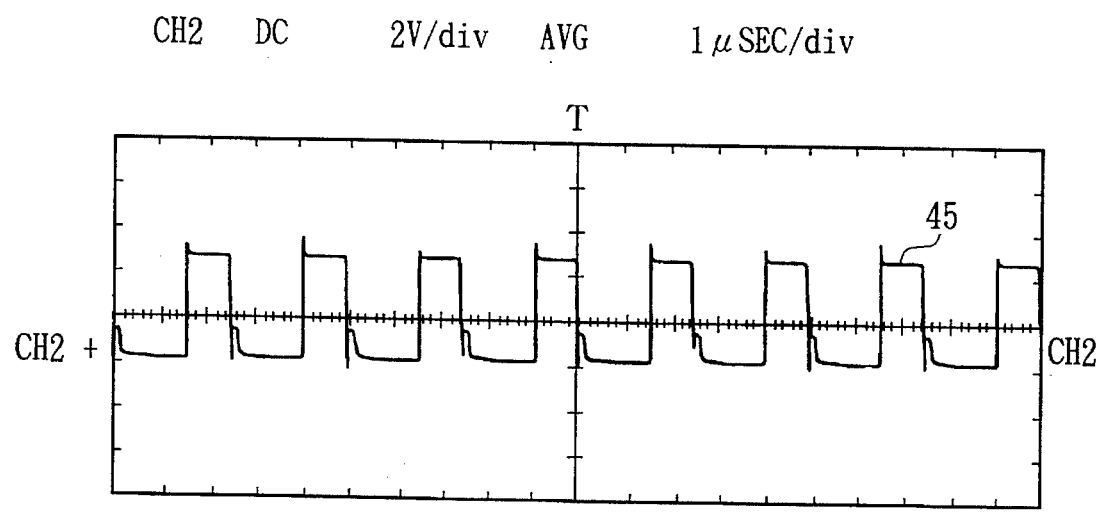
FIG. 7 gives experimental results obtained with the first embodiment.
Figure 8:
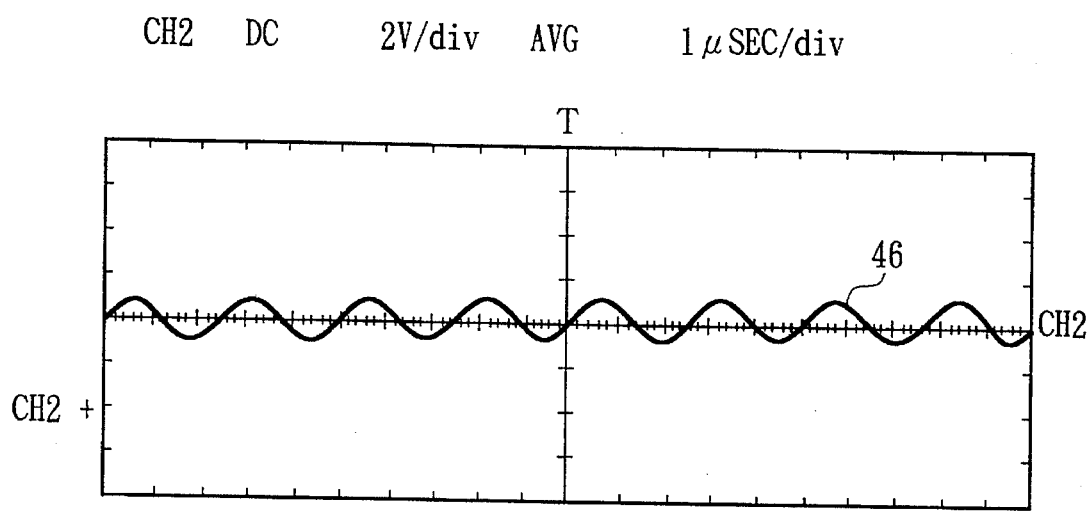
FIG. 8 gives experimental results obtained with the first embodiment.
Figure 9:
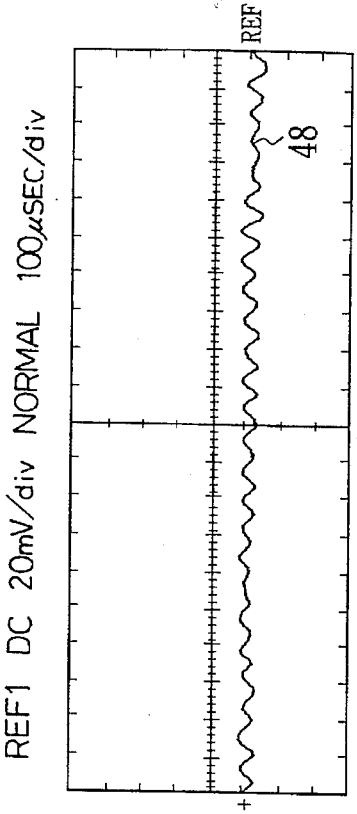
FIGS. 9(a) to 9(d) are experimental results obtained with the first embodiment.
Figure 9:
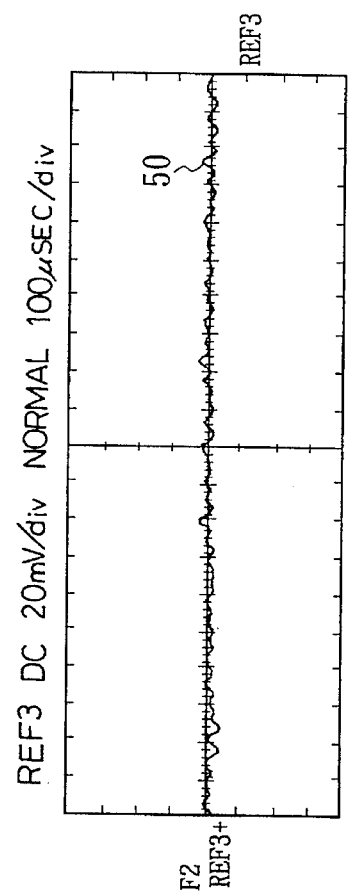
Figure 9:
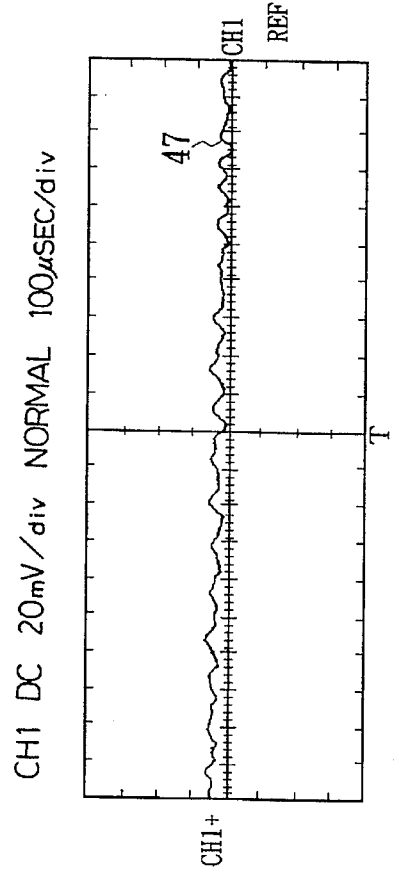
Figure 9:
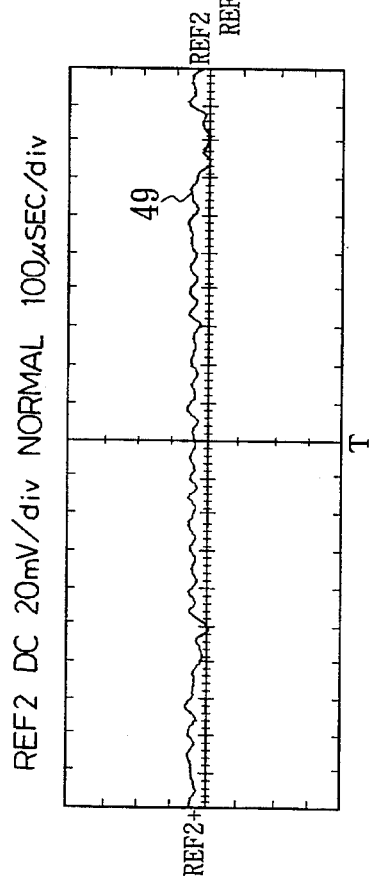

Next, a description will be given of the experimental method employed in the experimental arrangement illustrated in FIG. 3 for detecting the beat between the optical pulses and an AC bias. Referring to FIG. 3, the repetition rate of the optical pulses from LED 3 when driven by pulse generator 4 was set at 400 kHz, and the frequency of the AC component of the bias voltage applied by oscillator 25 was set at 400 kHz+$\Delta f$. A test was then run to ascertain whether or not a component corresponding to the beat frequency of was seen in the tunnel current. FIG. 7 shows waveform 45 of the pulses that drive LED 3 (400 kHz). FIG. 8 shows waveform 46 of the AC component of the bias voltage (400 kHz). A DC component of +2 V was superimposed on this as an offset so that the voltage finally applied to object being measured 1 was a sine wave varying between +1 V and +3 V. Feedback control was carried out so that the resulting average tunnel current became 1 nA.

With this setup, the output from preamplifier 7, which corresponds to the tunnel current, was measured in a single shot using digital oscilloscope 30. In order to detect only the beat component $\Delta f$, any components in the vicinity of 400 kHz, which is the fundamental frequency, were removed by low-pass filter 32. The repetition rate of the optical pulses and the frequency of the AC bias voltage were measured by frequency counter 31.

Figure 10:
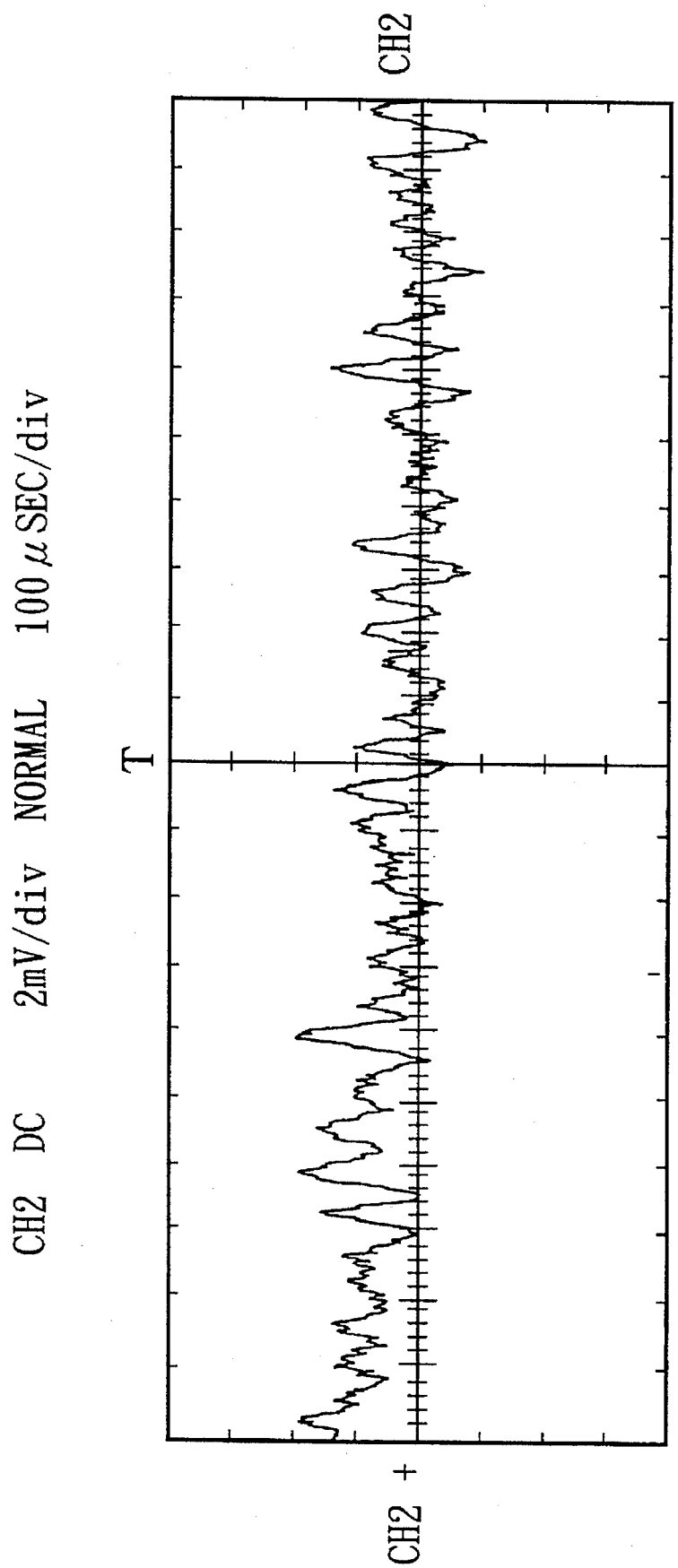
FIG. 10 gives experimental results obtained with the first embodiment.

Next, FIGS. 9(a) to 9(d) show results obtained when semi-insulating type InP was used as test object 1, while FIG. 10 shows results obtained when semi-insulating type GaAs was used. FIG. 9(a)–(d) show, respectively, output waveforms 47–50 obtained when the above-mentioned $\Delta f$ was set at 9.54 kHz, 13.96 kHz, 17.27 kHz and 20.05 kHz. FIG. 10 shows output waveform 51 obtained when $\Delta f$ was 20kHz. In each case, irregularities corresponding to the beat can be clearly identified. The number of irregularities corresponds to each value of $\Delta f$, and it will be seen that the number of irregularities increases with increasing $\Delta f$. The amplitude is of the order of 1 nA, and this also corresponds closely to the preset average tunnel current of 1 nA.

In this first embodiment of the invention, a beat component can also be extracted in the manner described above by varying the optical pulses irradiating object being measured 1 and the alternating voltage applied to the object being measured. This is none other than performing sampling. When there is a need to measure a high speed alternating voltage signal, it will be possible to make the desired measurement by means of the above-mentioned sampling, provided that ultrahigh-speed optical pulses are employed. With this invention, high-speed sampling that has previously been impossible by electronic measurement can be carried out easily. The industrial value of this is extremely high.

This first embodiment of the invention has been described in terms of cases in which metal was used as probe 2 and a semiconductor wafer was used as object being measured 1. However, similar results were obtained in the opposite case, namely, where a semiconductor was used as probe 2 and metal and/or semiconductor was used as object being measured 1. Furthermore, the region in which the tunnel current is produced has a minute area, and therefore good results were obtained even when the object being measured had a minute pattern. It may also be noted that the tracking system was satisfactorily fast even when picosecond or subpicosecond optical pulse widths were employed. Approximately the same effects were also obtained when a group II–VI semiconductor was used. Although this first embodiment of the invention has been illustrated in terms of the use of semi-insulating type semiconductors, a similar effect was obtained (albeit sensitivity was somewhat lower) when p-type or n-type semiconductors were used.

Figure 1B:
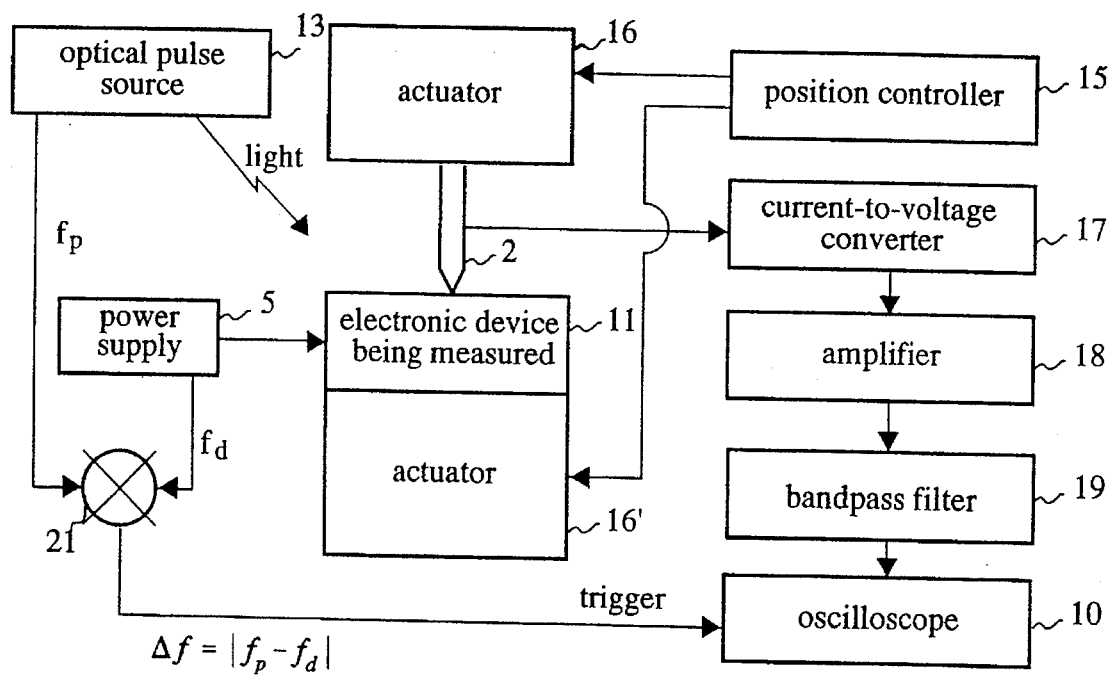

The results of measurements carried out using the circuit shown in FIG. 1b are given in FIG. 11. Periodic pulses of light were generated from optical pulse source 13 by periodic excitation, and this was done in such manner that the phases of these pulses of light and of the operation of electronic device under test 11 diverged little by little. In specific terms, the trigger signal applied to electronic device under test 11 from power supply 5 was set at 100.000 MHz, while the repetition rate of optical pulse source 13 was set at 100.001 MHz. In other words, electronic device under test 11 was set so as to operate repeatedly at a repetition rate fd of 100.000 MHz, while the repetition rate fp of the optical pulses was set at 100.001 MHz. The wavelength of the optical pulses was 670 nm and their pulse width was 80 ps. The horizontal axis in FIG. 11 is the time axis and the vertical axis is the voltage level (drawn to an arbitrary scale). One division on the time axis is 200 µs, which means that the repetition period that appears in FIG. 11 is 1000 µs. In other words, the repetition rate is 1 kHz. This is equivalent to the difference frequency between the repetition rate of the optical pulses and the frequency of the trigger signal, namely:

$$\Delta f = |fp - fd| = 1 kHz$$

FIG. 12 illustrates the characteristics of a comparison, showing the result obtained when the actual operation of electronic device 11 was measured directly using, not the method according to this invention, but an extremely expensive measuring instrument (in this case, a Yokogawa DL8100). The horizontal axis in FIG. 12 is the time axis and the vertical axis is the voltage level (drawn to an arbitrary scale). One division on the time axis of FIG. 12 is 2 ns. It will therefore be seen that what is observed in FIG. 12 is a repetition period of 10 ns, or in other words, the response characteristics of electronic device under test 11 when triggered by a trigger signal with a repetition rate of 100 MHz.

Comparison of FIG. 11 and FIG. 12 shows that, since the repetition rate in FIG. 11 is 1 kHz, what in effect has been achieved is to observe the response waveform of electronic device 11, which operates at the 100 MHz repetition rate shown in FIG. 12, by means of an inexpensive ordinary oscilloscope capable of measuring 1 kHz. Side-by-side comparison of FIG. 11 with FIG. 12 shows that even the fine response curve in FIG. 11 (i.e., the response on a time scale of the order of 300 ps) is in good correspondence with that shown in FIG. 12, which indicates that faithful measurements can be performed by means of a device embodying this invention.

The extremely expensive measuring instrument which was mentioned above and which was used for making the comparison measurements, is the most sophisticated of the instruments to which the inventor's laboratory has direct access, and it is an instrument capable of measuring waveforms of the order of 300 ps (in frequency terms, this corresponds to 3 GHz). An instrument capable of making faithful measurements of waveforms with shorter periods than this is simply not available, and even if it were, it would inevitably be an extremely elaborate and expensive device. It is not difficult to increase the optical pulse repetition rate in a device embodying this invention to 10–100 times the 100 MHz which was used in the foregoing examples of measurement, and with a few clever modifications of equipment, it will be possible to increase it to over 1000 times this value. This means that this invention will make it possible to observe phenomena occurring on an electronic device at frequencies in excess of 10 GHz or 100 GHz by using a measuring instrument such as a quite ordinary synchroscope capable of measurements of the order of 1 MHz. In other words, it is evident that this invention enables measurements to be made of signal waveforms in ranges which previously could not be measured. An instrument which is capable of providing accurate observations of the state of the signals which occur on semiconductor devices in such ranges will in the future inevitably become an essential device, and hence an instrument according to this invention will become an extremely useful device in this field.

In the foregoing explanation, in order to obtain measurement results that were easy to understand, the frequency of the trigger signal applied to electronic device under test 11 using the circuit shown in FIG. 1b was set at 100.000 MHz, while the repetition rate of optical pulse source 13 was set at 100.001 MHz exactly. In actual measurements, however, measurements which are similar to those described above can be carried out to a sufficient extent in practice by generating optical pulses at a rate which is nearly equal to the characteristic operating frequency of electronic device 11 under test. In other words, even if the difference between the two frequencies (Δf) is not accurately fixed, a practical measuring circuit can easily be achieved if synchronization circuit 20 is used as indicated in FIG. 1a to synchronize the optical pulse repetition rate (fp) of optical pulse source 13 and the operating frequency (fd) of electronic device 11 under test so that they operate at the same frequency. Alternatively, a practical measuring circuit can easily be achieved by using a separate frequency generator as indicated in FIG. 1b to set the optical pulse repetition rate (fp) and the operating frequency (fd) of electronic device 11 under test to the same frequency. If an actual measurement system is built to operate in the extremely high frequency regime, the mutual phases of the two frequencies will inevitably diverge, little by little, due to ambient noise, small fluctuations of the measurement system, and other influences. In other words, when a practical synchronization circuit 20 or a practical frequency generator is used, what will actually happen is that the repetition rate of the optical pulses and the operating frequency of the electronic device being measured will little by little become out of phase (or, the frequencies involved will diverge), with the result that observations of the sort described above can be carried out to a sufficient extent in practice even if circuits which will accurately synchronize the phases and then bring them little by little out of phase have not been specially provided.

Figure 13A:
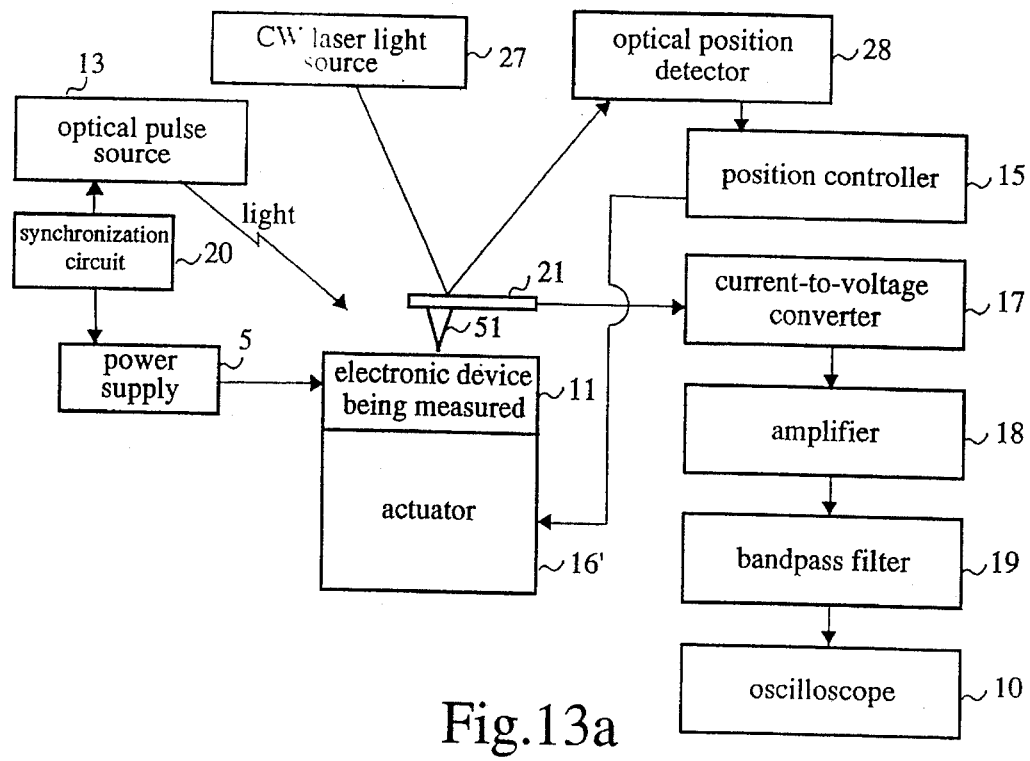
FIGS. 13a and 13b are a block diagrams of a device according to a second embodiment of this invention.
Figure 13B:
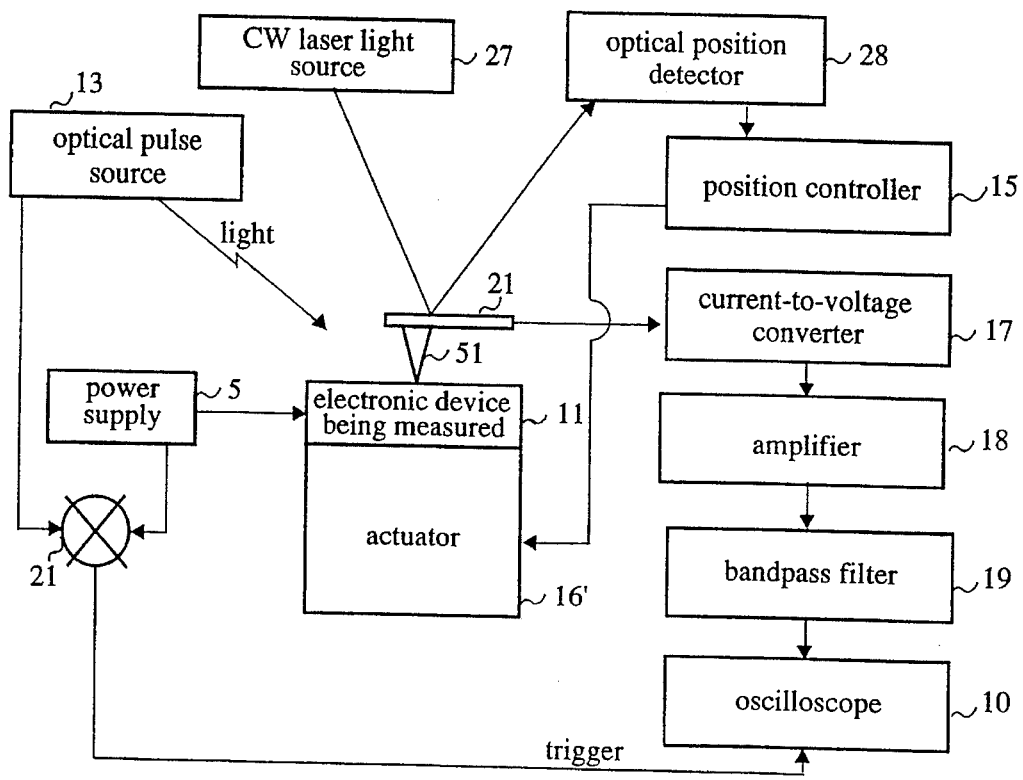

Next, a second embodiment of this invention will be explained with reference to FIGS. 13a and 13b which are block diagrams of this second embodiment. In this second embodiment, in similar manner to an ordinary atomic force microscope, the position of probe tip 51 is detected in terms of the position of light from continuous-wave laser light source 27 after it has been reflected by the back of probe arm 21, and is controlled by a position control system that includes optical position detector 28. In this case, the position control system and the electrical measurement system can be completely independent. In similar manner to the first embodiment of this invention, which was illustrated in FIG. 1, this second embodiment can have the constitution shown in FIG. 13a or the constitution shown in FIG. 13b, according to the means used to synchronize the measurement timing.

Figure 14A:
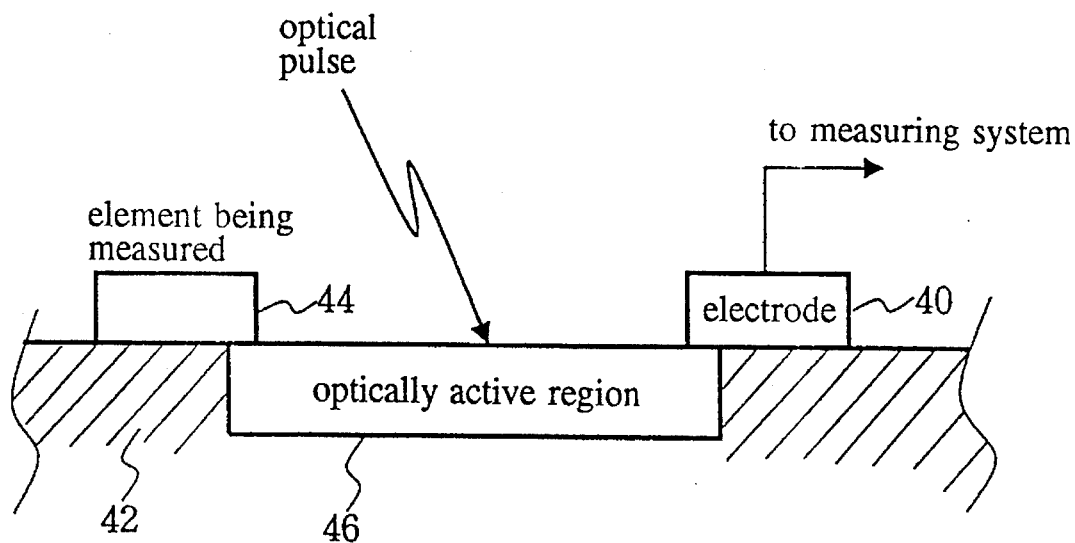
FIGS. 14a and 14b show a third embodiment of this invention.
Figure 14B:
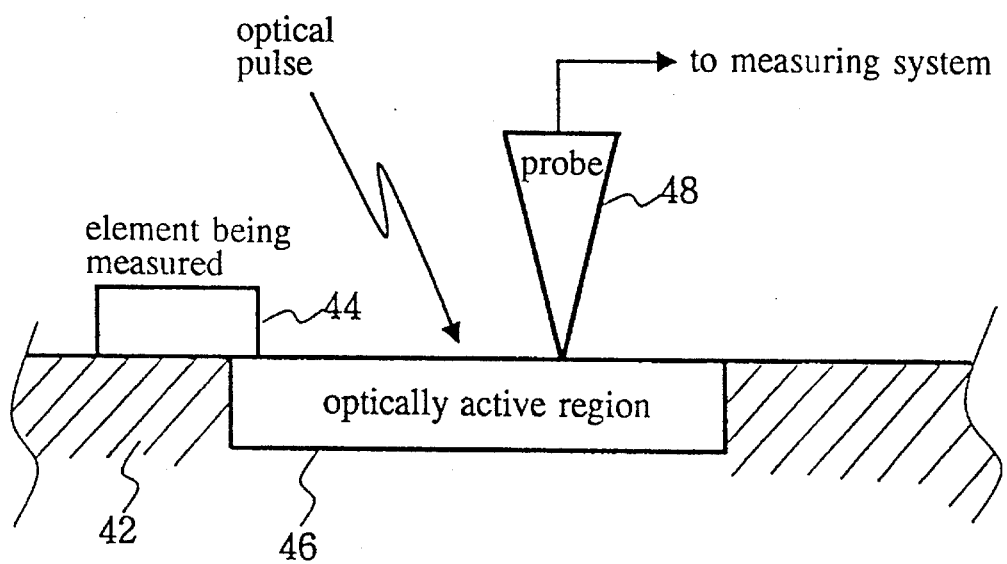

Next, a third embodiment of this invention will be explained with reference to FIGS. 14a and 14b. As shown in FIG. 14a, this invention can be applied to an electronic device where this is a semiconductor integrated circuit 42 which has measuring electrode 40 connected to a measuring instrument, and wherein element being measured 44 and measuring electrode 40 are connected by optically active region 46 made of an optically active material. Furthermore, as shown in FIG. 14b, even if there is no measuring electrode, high-speed electric signals in element being measured 44 can be measured by bringing probe 48 into contact with optically active region 46 made of an optically active material which is connected to element being measured 44.

The constitution of a fourth embodiment of this invention will now be explained with reference to FIGS. 15, which are block diagrams of a device according to this fourth embodiment. This embodying device is an electric measuring instrument which is provided with probe 2 which is brought into close proximity with the electronic device being measured, and which also has current-to-voltage converter 17, amplifier 18, bandpass filter 19 and oscilloscope 10, which together serve as a means for measuring the current flowing in this probe 2.

The distinguishing features of this embodying device are that optically active material 12, which is in a non-conductive state in the measurement environment, is included between probe 2 and current-to-voltage converter 17, and that it is provided with optical pulse source 13 as a means for producing intense pulses of light which serve to make this optically active material 12 conductive. Optically active material 12 may be a group IV semiconductor, a group III–V semiconductor, or a group II–VI semiconductor. In this fourth embodiment of the invention, probe 2 in its entirety is constituted as a probe tip.

Figure 15A:
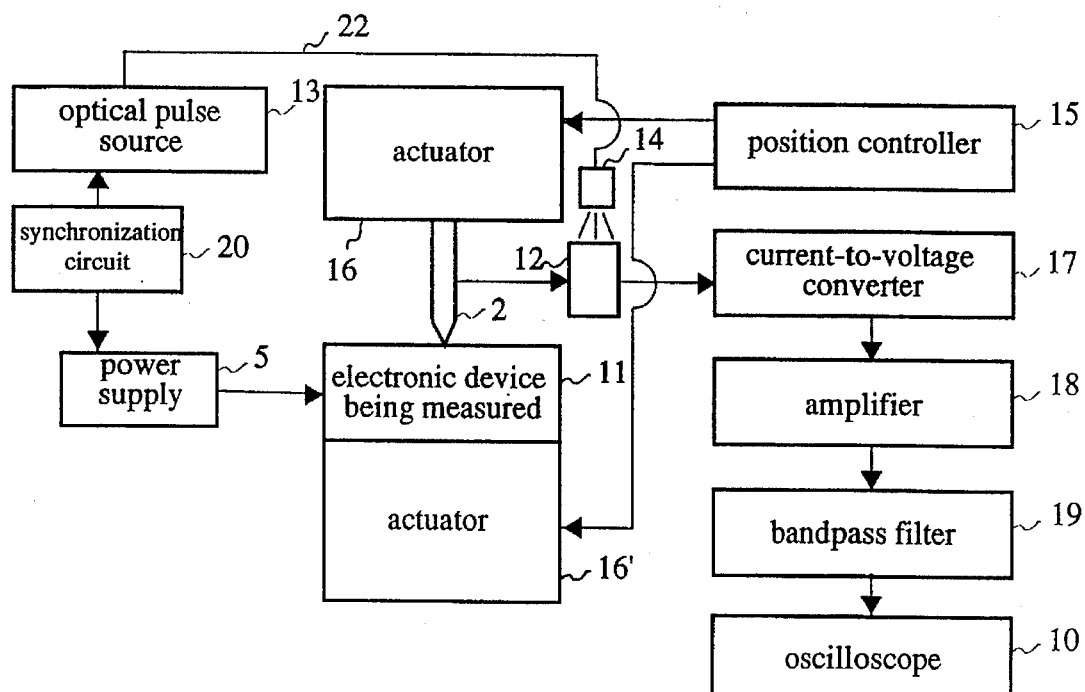
FIGS. 15a and 15b are a block diagrams of a device according to a fourth embodiment of this invention.
Figure 15B:
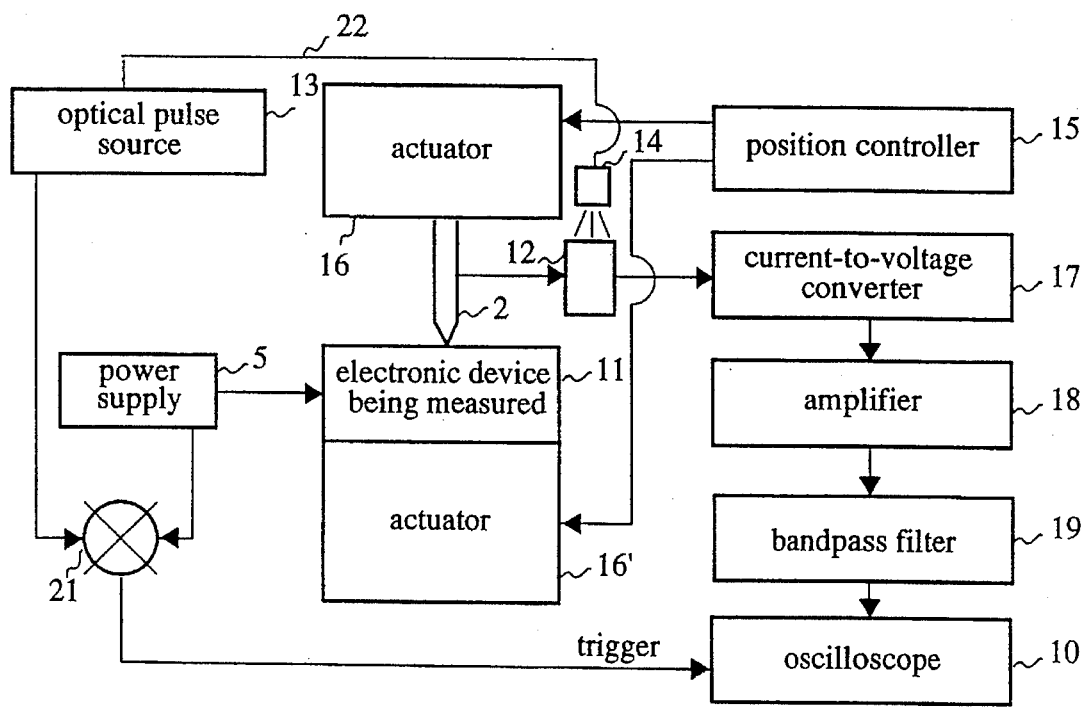

The aforementioned pulses of light are periodic pulses of light, and in FIG. 15a, optical pulse source 13 and power supply 5 are synchronized by synchronization circuit 20, while in FIG. 15b there is a means which synchronizes the measurement timing of oscilloscope 10 with optical pulse source 13. Optical pulses generated by optical pulse source 13 are beamed onto optically active material 12 from lens 14 by way of optical fiber 22.

Probe 2 is installed on actuator 16, and electronic device under test 11 is set up on actuator 16'. The distance between these two actuators 16 and 16' is controlled to a preset value by position controller 15.

In this fourth embodiment of the invention, the beat component between the optical pulses irradiating electronic device under test 11 and the alternating voltage applied to the electronic device can be extracted by varying the optical pulses and said alternating voltage. This is none other than performing sampling. Accordingly, when there is a need to measure a high speed alternating voltage signal, it will be possible to make the desired measurement by means of the above-mentioned sampling, provided that ultrahigh-speed optical pulses are employed. With this embodying device, high-speed sampling that has previously been impossible by electronic measurement can be carried out easily. The industrial value of this is extremely high.

This fourth embodiment of the invention has been described in terms of cases in which metal was used as probe 2 and a semiconductor wafer was used as electronic device under test 11. However, similar results were obtained in the opposite case, namely, when a semiconductor was used as probe 2 and metal and/or semiconductor was used as electronic device under test 11. Furthermore, the region in which a tunnel current is produced has a minute area, and therefore good results were obtained even when the device being measured had a minute pattern. It may also be noted that the tracking system was satisfactorily fast even when picosecond or subpicosecond optical pulse widths were employed. Approximately the same effects were also obtained when a group II–VI semiconductor was used. Although this fourth embodiment of the invention has been illustrated in terms of the use of semi-insulating type semiconductors, a similar effect was obtained (albeit sensitivity was somewhat lower) when p-type or n-type semiconductors were used.

Figure 16A:
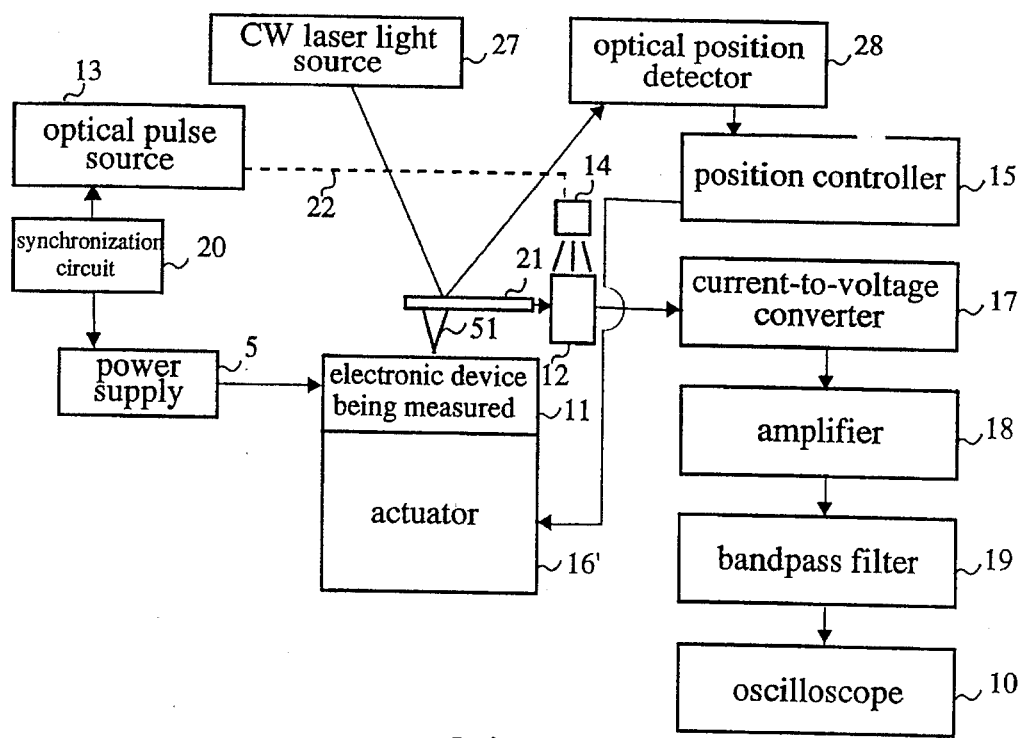
FIG. 16a and 16b are a block diagrams of a device according to a fifth embodiment of this invention.
Figure 16B:
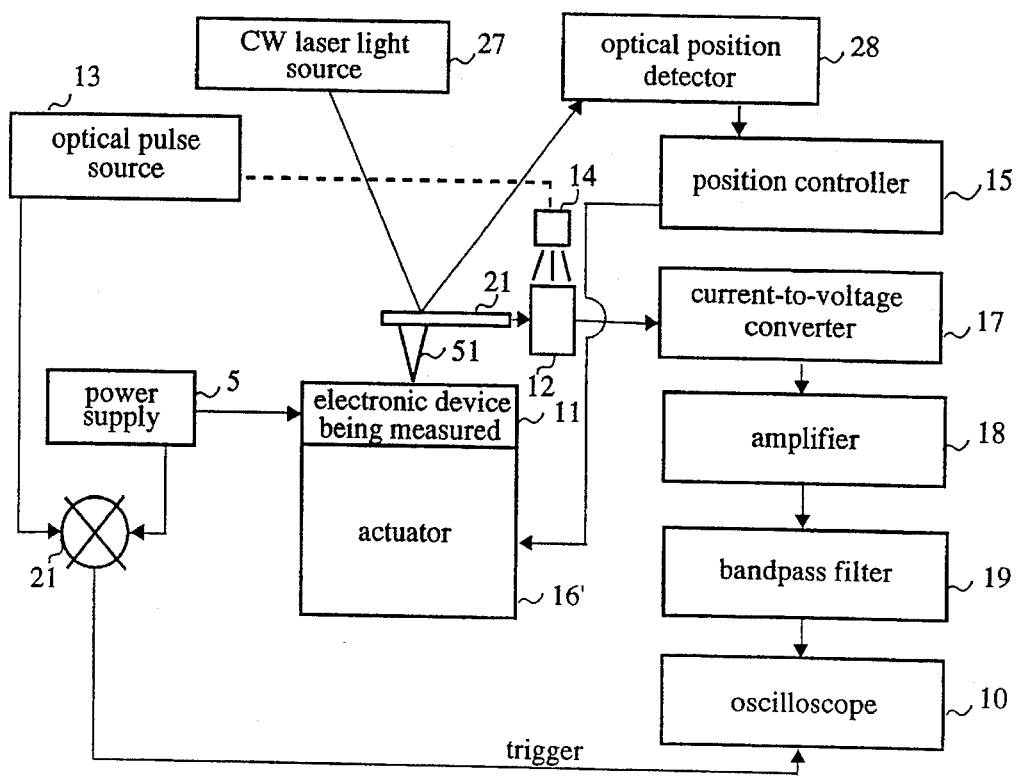

Next, a fifth embodiment of this invention will be explained with reference to FIGS. 16a and 16b, which are block diagrams of this fifth embodiment. In this fifth embodiment, in similar manner to an ordinary atomic force microscope, the position of probe tip 51 is detected in terms of the position of light from continuous-wave laser light source 27 after it has been reflected by the back of probe arm 21, and is controlled by a position control system that includes optical position detector 28. In this case, the position control system and the electrical measurement system can be completely independent. In similar manner to the fourth embodiment of this invention, which was illustrated in FIGS. 15a and 15b, this fifth embodiment can have the constitution shown in FIG. 16a or the constitution shown in FIG. 16b, according to the means used to synchronize the measurement timing.

Figure 17:
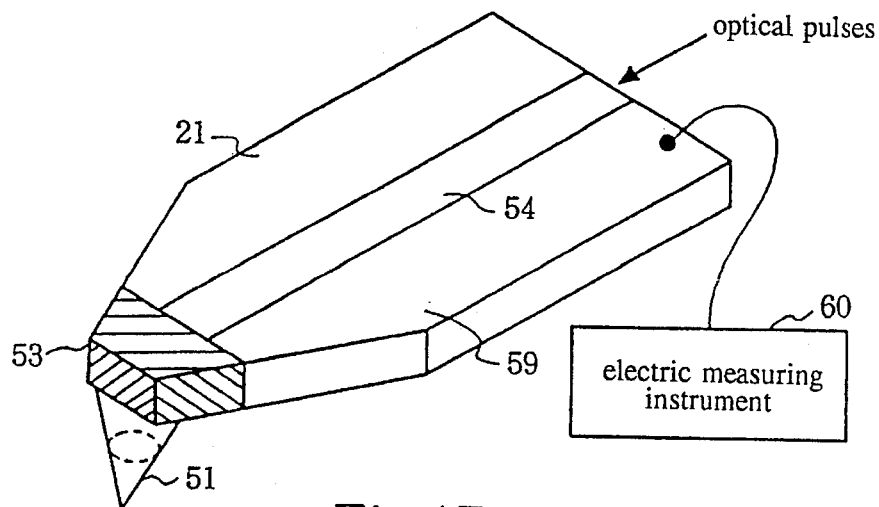
FIG. 17 is a perspective view of a sixth embodiment of this invention.

The constitution of a sixth embodiment of this invention will be explained with reference to FIG. 17, which is a perspective view of this sixth embodiment. This embodiment has probe tip 51 which is made of metal and is brought into close proximity with the electronic device being measured, and probe 2 transmits to electric measuring instrument 60 the electric potential at the point with which probe tip 51 is in close proximity.

The distinguishing features of this embodiment are that optically active material 53 is interposed between probe tip 51 and electrical path 59 which is provided on arm 21 and which culminates in electric measuring instrument 60, and that there is provided optical waveguide 54 which guides light to this optically active material 53.

Next, the operation of this sixth embodiment of the invention will be explained. Optically active material 53 is formed from a group IV, group III–V, or group II–VI semiconductor, and electric current can flow through this material while it is being irradiated with light. At other times, it becomes non-conductive. When no light is striking it, optically active material 53 shown by the hatching in FIG. 17 is non-conductive, with the result being that probe tip 51 is insulated from electrical path 59. When light is striking it, optically active material 53 becomes conductive and sampling can be performed by means of electrical measuring device 60. Although metal was used for electrical path 59 in this sixth embodiment of the invention, it is also feasible to provide a metal film on the surface of a semiconductor or an insulating material.

Figure 18A:
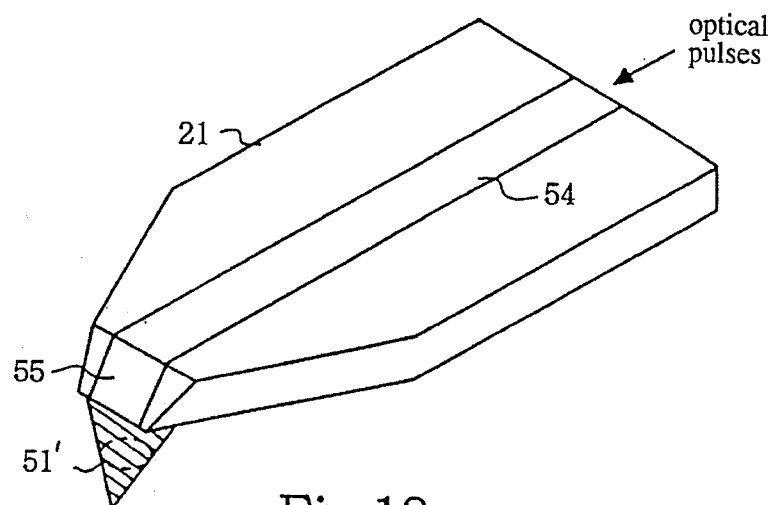
FIGS. 18a and 18b are a perspective views of a seventh embodiment of this invention.
Figure 18B:
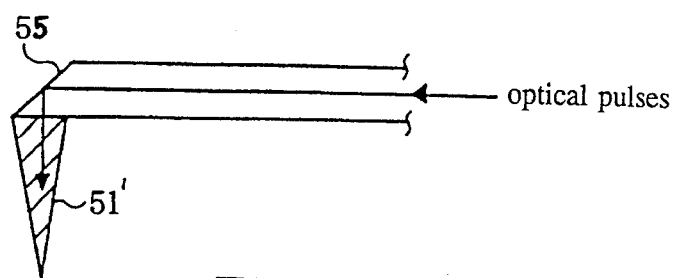

Next, a seventh embodiment of this invention will be explained with reference to FIGS. 18a 18b, which are perspective views of the seventh embodiment. This seventh embodiment uses probe tip 51' formed from an optically active material instead of metal. Probe tip 51' is irradiated with optical pulses by way of reflecting surface 55 which is provided at the end of optical waveguide 54, which in turn has been provided on arm 21. This seventh embodiment of the invention requires fewer component parts than the sixth embodiment.

Figure 19:
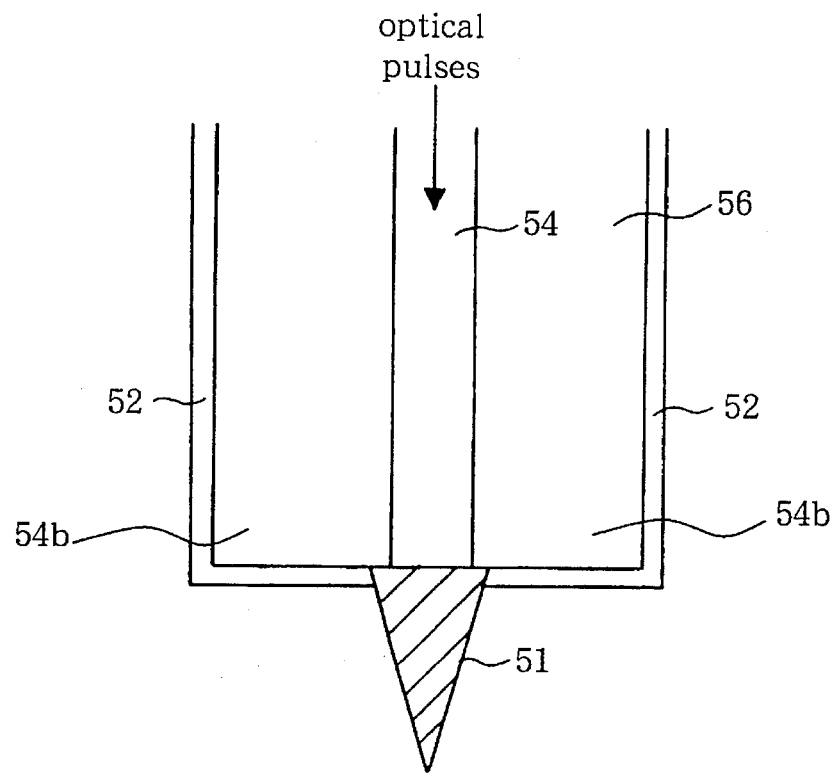
FIG. 19 shows the constitution of an eighth embodiment of this invention.
Figure 20:
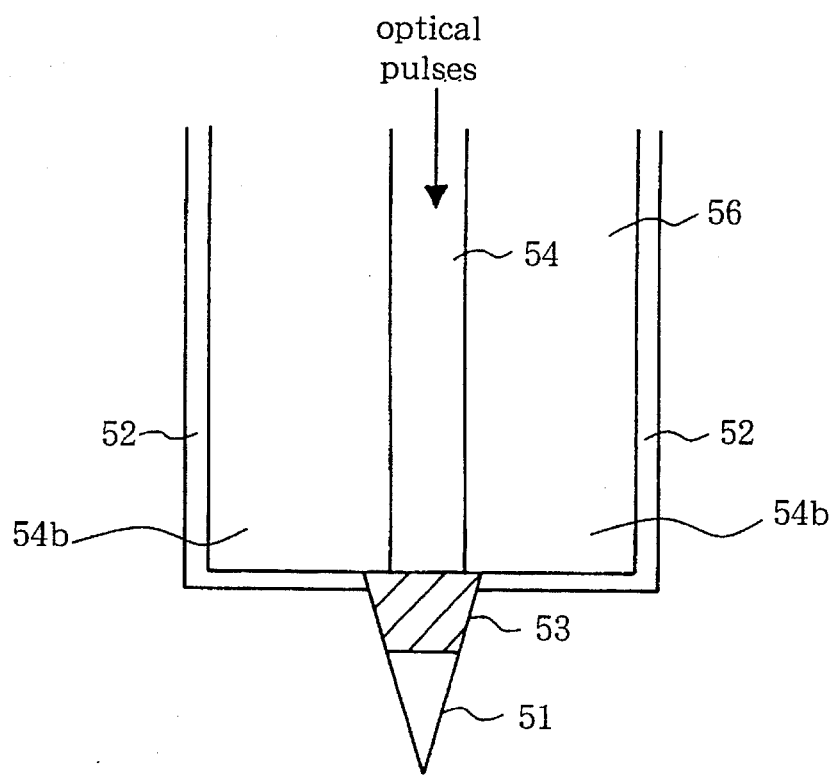
FIG. 20 shows the constitution of a ninth embodiment of this invention.

Next, eighth and ninth embodiments of this invention will be explained with reference to FIG. 19 and FIG. 20, which show the respective constitutions. In the eighth embodiment, as shown in FIG. 19, the core of optical fiber 56 is taken as optical waveguide 54, and probe tip 51', which is formed of an optically active material, is provided at the end of this waveguide. The cladding of the optical fiber 56 is shown in FIGS. 19 and 20 as reference number 54b. The periphery of optical fiber 56 is coated with metal, and this metal coating constitutes electrical path 52. This embodiment has still fewer component parts than the sixth or seventh embodiments of this invention.

In the ninth embodiment of this invention, as shown in FIG. 20, optically active material 53 is interposed between metal probe tip 51 and optical waveguide 54. Although the overall constitution of this embodiment is the same as that of the eighth embodiment, probe tip 51 is used for objects being measured when a metal tip is appropriate.

Figure 21:
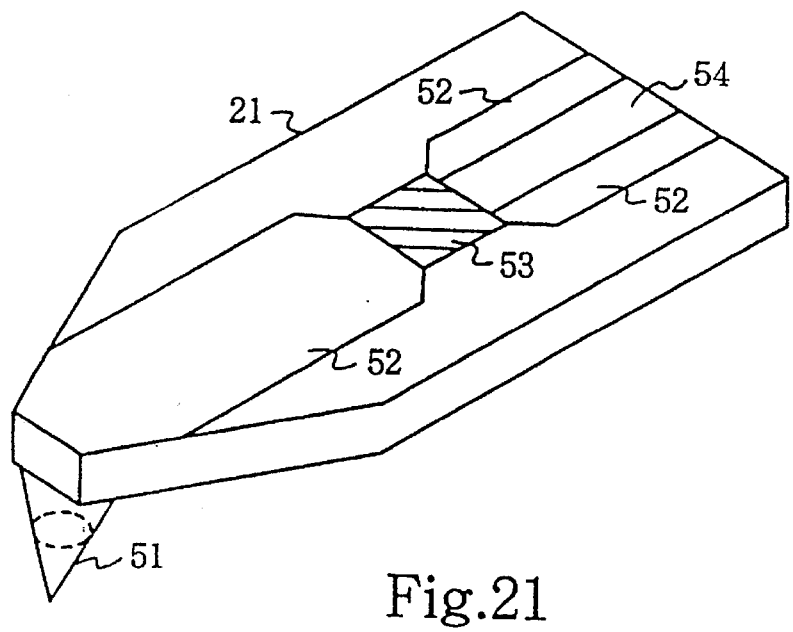
FIG. 21 is a perspective view of a tenth embodiment of this invention.

Next, a tenth embodiment of this invention will be explained with reference to FIG. 21, which is a perspective view showing the tenth embodiment. Electrical path 52 is connected to metal probe tip 51, the electrical path being provided on arm 21 and having optically active material 53 interposed in an intermediate position. In addition, optical waveguide 54 is provided parallel to electrical path 52. This tenth embodiment of the invention has the advantages that the shape of optically active material 53 may be an easy-to-fabricate shape such as a cube, and that, because it can be set in a variety of positions, there is a high degree of freedom as regards probe design.

Figure 22:
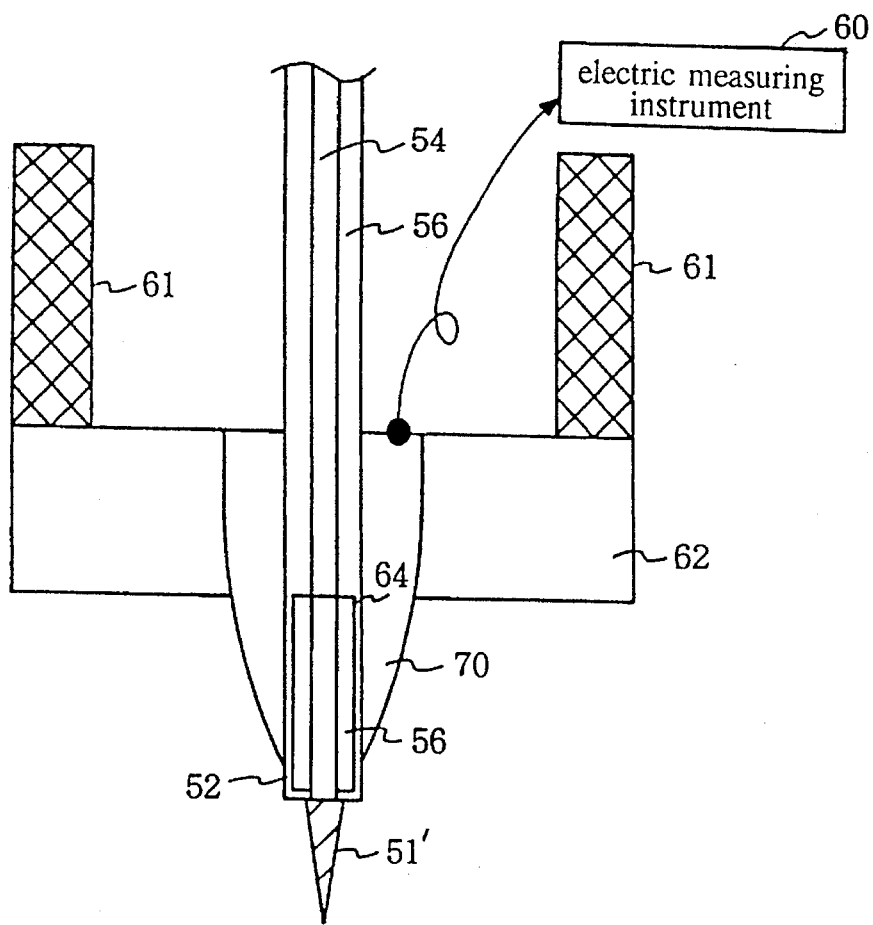
FIG. 22 shows the constitution of an eleventh embodiment of this invention.

Next, an eleventh embodiment of this invention will be explained with reference to FIG. 22, which shows the constitution of the eleventh embodiment. Probe tip 51' is made of an optically active material and is connected to optical fiber 56 which has a metal coating on its periphery. This is the same as in the previously explained eighth embodiment of this invention. Optical fiber 56 serves as optical waveguide 54 and can be freely connected and disconnected at joint surface 64. Electrical path 52 comprising a metal coating around the periphery of optical fiber 56 is in contact with conductive fiber holder 70, and this conductive fiber holder 70 is connected to electric measuring instrument 60. Conductive fibre holder 70 is supported by insulator 62 made of ethylene tetrafluoride resin. This insulator 62 is joined to tubular piezoelectric element 61. Probe tip 51' and metal coated optical fibre 56 thus constitute an integrally replaceable component, and only this has to be replaced when wear occurs. Moreover, by having probe tips 51' of various shapes ready for use, the probe tip can be changed over in accordance with the object being measured.

Figure 23:
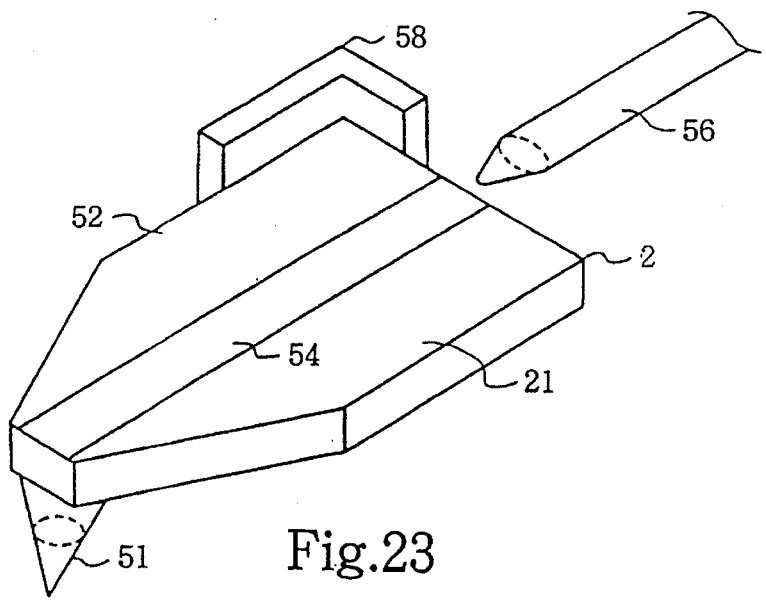
FIG. 23 shows the introduction of an optical pulse into a probe.

Next, an example of introducing an optical pulse into a probe will be explained with reference to FIG. 23. Probe 2 is supported by probe fixing guide 58 as shown in FIG. 23. Although the coupling efficiency from optical fibre 56 into optical waveguide 54 provided in arm 21 is relatively low, this does not constitute an obstacle, and by polishing the tip of optical fibre 56 to a point and thereby increasing this efficiency, improved performance can be obtained. The same can be achieved using a lens.

Figure 24:
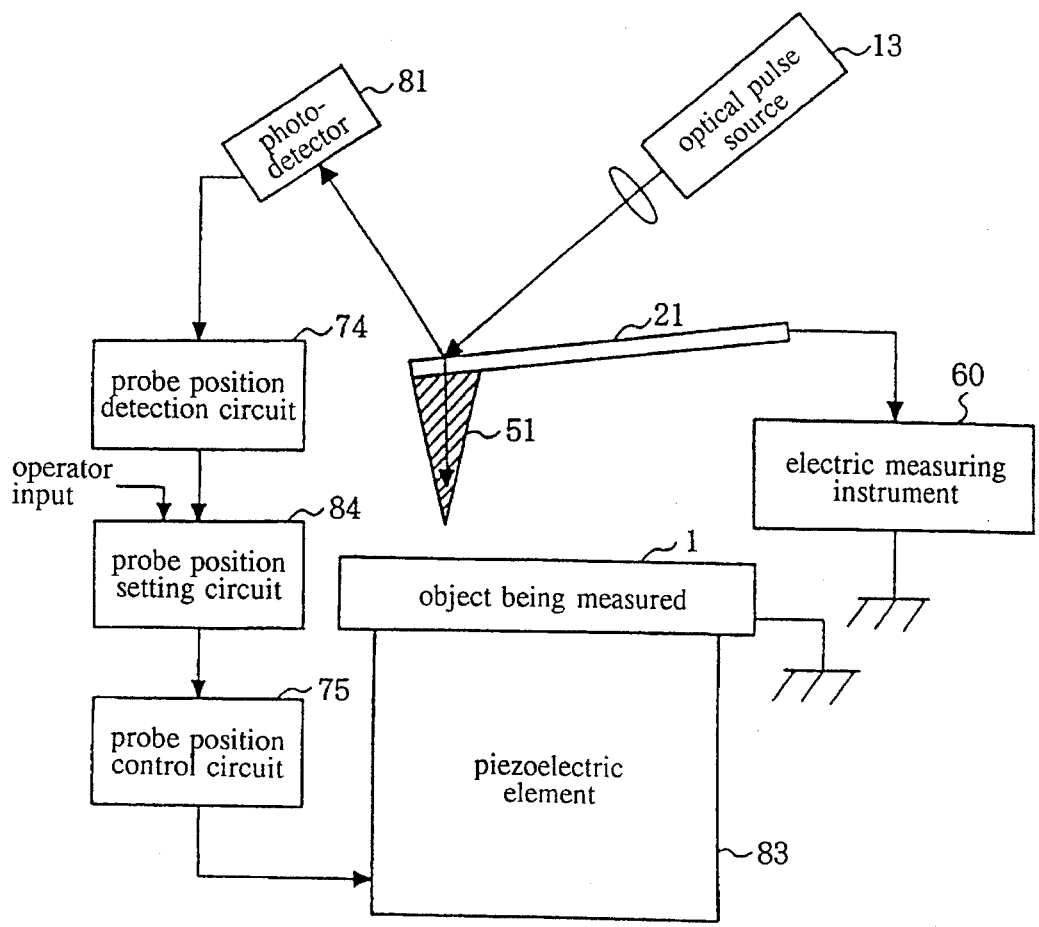
FIG. 24 is a block diagram of a twelfth embodiment of this invention.

The constitution of a twelfth embodiment of this invention will be explained with reference to FIG. 24, which is a block diagram of a device according to the twelfth embodiment. This device is an atomic force microscope which is provided with probe arm 21; probe tip 51 which is fitted to this arm 21 and is brought into close proximity with object being measured 1; optical pulse source 13 which irradiates this arm 21 with light; probe position detection circuit 74 which detects the position of probe tip 51 by means of reflected light from arm 21; and probe position control circuit 75 which controls the relative positions of probe tip 51 and object being measured 1.

The distinguishing features of this device are that at least part of arm 21 and probe tip 51 is formed of an optically active material which is non-conductive in the measurement environment but exhibits conductivity as a result of irradiation with light; and that it has a means which introduces light that has been emitted from optical pulse source 13 into this optically active material; and that it has electric measuring instrument 60 which detects the current or potential between probe tip 51 and object being measured 1. In this twelfth embodiment, probe tip 51 is formed from an optically active material, arm 21 is formed from a conductive material, and this arm 21 is electrically connected to electric measuring instrument 60. In addition, the aforementioned means which introduces light comprises a semitransparent mirror which is provided at the end of arm 21, and probe tip 51 is arranged at the position where the light that passes through this semitransparent mirror will strike.

Next, the operation of a device according to this twelfth embodiment will be explained. Probe position setting circuit 84 causes probe tip 51 to be brought into close proximity with a given position on object being measured 1, in accordance with operator input. Now, the purpose of this twelfth embodiment of the invention is the electrical measurement of an electronic device (i.e., object being measured 1 is an electronic device). Accordingly, probe tip 51 can also be brought into close proximity with a desired position on object being measured 1 by having probe position detection circuit 74 detect whether or not probe tip 51 is tracing the convex region corresponding to a desired wiring position on the electronic device, taking this detection output as input to probe position setting circuit 84, and having probe position control circuit 75 drive piezoelectric element 83.

Probe tip 51, which has been brought into close proximity with a desired position in this manner, is in itself electrically non-conductive, and consequently does not have any electrical effect on the operating characteristics of the electronic device which is object being measured 1. At this point, if the optically active material which forms probe tip 51 becomes electrically conductive by irradiation with light from optical pulse source 13, the current present at the point being measured, which is in close proximity to probe tip 51, will flow to probe tip 51. Electric measuring instrument 60 measures this, with the result being that electrical measurements can be made of the electronic device. Optical sampling in accordance with the period of the pulses from optical pulse source 13 can also be carried out.

Figures 25A, 25B:
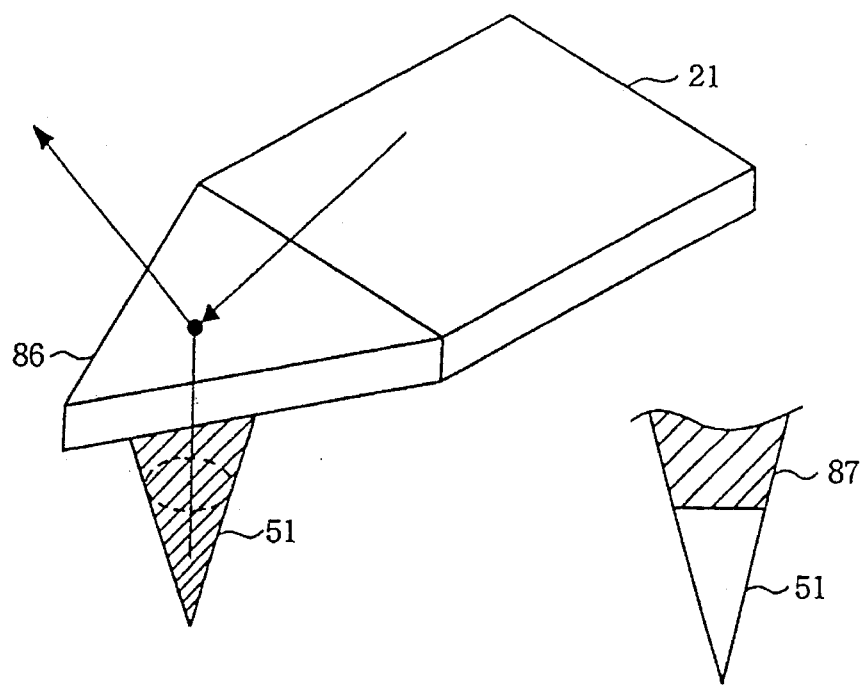
FIGS. 25a and 25b show the constitution of the probe in the twelfth embodiment.

Next, the probe in this twelfth embodiment of the invention will be explained with reference to FIGS. 25a and 25b, which shows the constitution of the probe. Arm 21 is made of metal. As shown in FIG. 25a, the tip of arm 21 is constituted as semitransparent mirror 86. Half of the light from optical pulse source 13 is reflected and half irradiates probe tip 51. Because probe tip 51 is formed from an optically active material, it becomes electrically conductive as a result of irradiation with light. The optically active material used in this twelfth embodiment of the invention is a group IV semiconductor. Group III–V and group II–VI semiconductors can also be used. The object being measured was a semiconductor device. For semitransparent mirror 86, the surface of a metal thin film was used as a specular surface. It is also feasible to use a dielectric multilayer film instead of a metal thin film.

Object being measured 1 is moved by micro-position control and probe tip 51 is placed in the desired position on the object. At this point in time, because no optical pulses are irradiating probe tip 51, the probe tip is non-conductive. Next, optical pulses are supplied from optical pulse source 13. Part of the light that strikes semitransparent mirror 86 passes through it and irradiates probe tip 51. The remaining part is reflected and is incident upon photodetector element 81, whereupon the position of probe tip 51 is detected. The optically active material that forms probe tip 51 becomes conductive due to the light irradiating the probe tip. Under these circumstances, the current at the desired position on the semiconductor device that is the object under test will flow by way of probe tip 51 into arm 21 which is made of a conductive metal, and will be measured by electric measuring instrument 60. Electric signals can therefore be sampled at intervals corresponding to the emission of successive optical pulses. During the period when no optical pulse is striking probe tip 51, the probe tip is electrically non-conductive and has no electrical effect on object under test 1. High reliability measurement results can therefore be obtained.

As shown in FIG. 25b, it is also feasible to form probe tip 51 of metal and to use an optically active material as intermediary 87 between this probe tip 51 and semitransparent mirror 86. The option of a metal probe tip 51 is used for suitable test objects.

Figure 26:
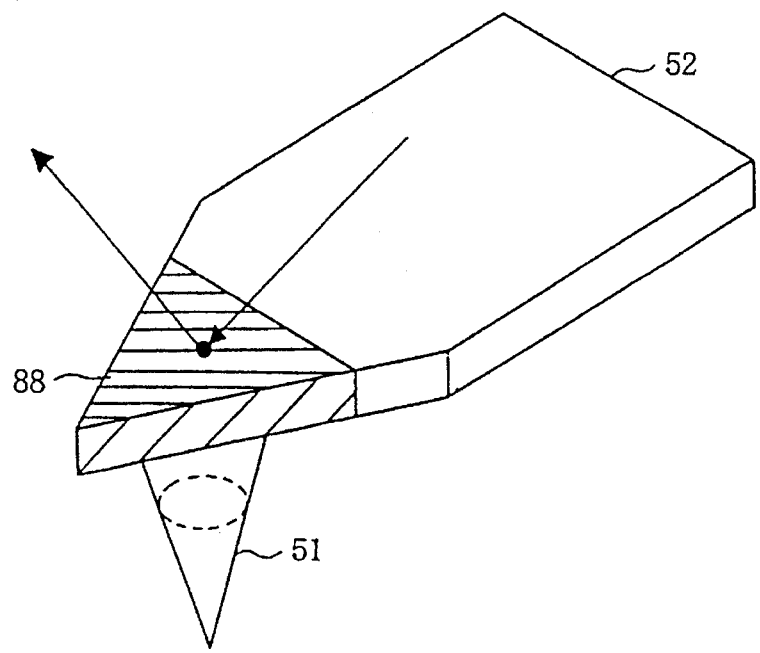
FIG. 26 shows the constitution of the probe in a thirteenth embodiment of this invention.

Next, a thirteenth embodiment of this invention will be explained with reference to FIG. 26, which shows the constitution of probe 2 in the thirteenth embodiment. An optically active material is used as reflecting surface 88 in the location at which semitransparent mirror 86 was provided in the twelfth embodiment. In this thirteenth embodiment, probe tip 51 is formed of metal. When the optically active material which forms reflecting surface 88 is irradiated with light from optical pulse source 13, it becomes conductive, whereupon probe tip 51 becomes electrically connected to electrical path 52.

Figure 27:
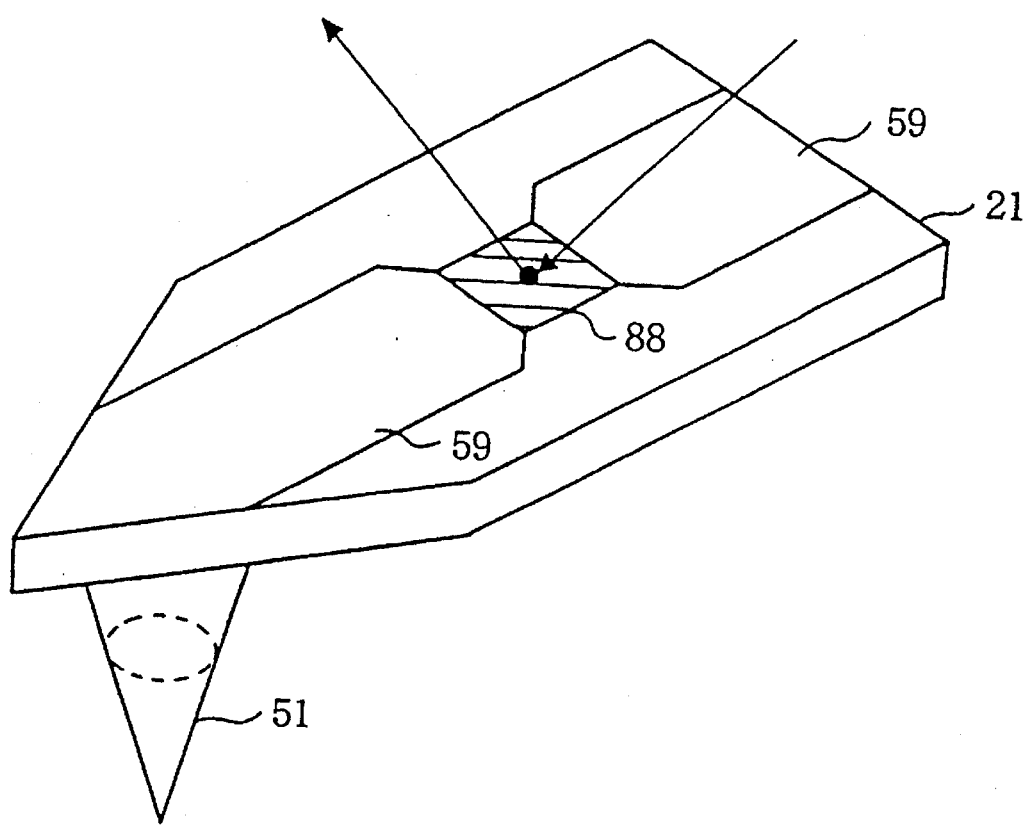
FIG. 27 shows the constitution of the probe in a fourteenth embodiment of this invention.

Next, a fourteenth embodiment of this invention will be explained with reference to FIG. 27, which shows the constitution of the probe in the fourteenth embodiment. In this fourteenth embodiment, arm 21 is formed of an ethylene tetrafluoride resin or other insulator, and electrical path 59 is provided on this. Reflecting surface 88 formed from an optically active material is interposed in the course of this electrical path. The working of this embodiment is the same as that of the thirteenth embodiment, but because reflecting surface 88 can be provided at any desired position on arm 21, this embodiment has the advantage of a larger degree of freedom as regards designing arm 21.

Figure 28:
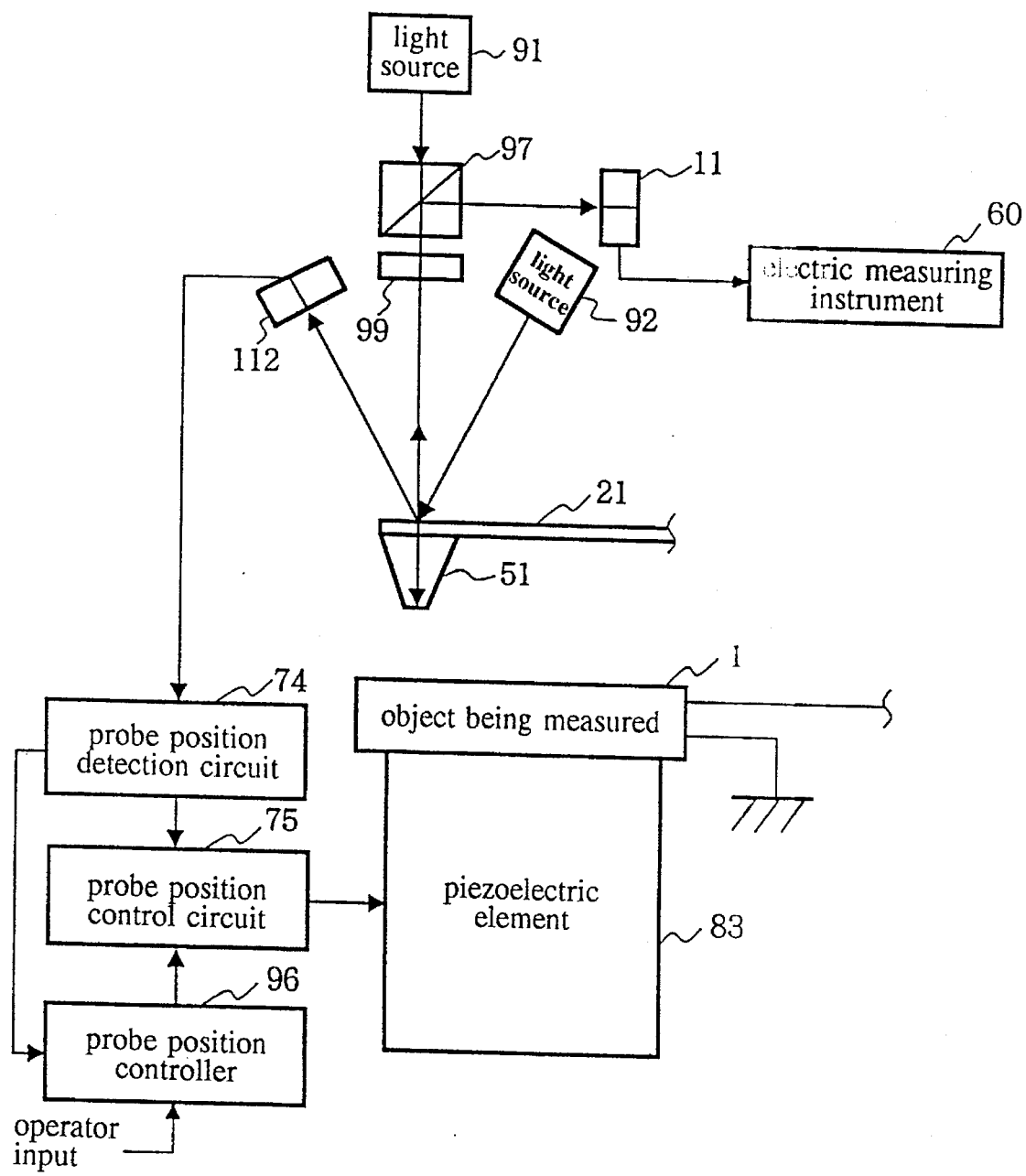
FIG. 28 is a block diagram of a device according to a fifteenth embodiment of this invention.

The constitution of a fifteenth embodiment of this invention will be explained with reference to FIG. 28, which shows the constitution of a device according to the fifteenth embodiment. This device is an electro-optic measuring instrument which is provided with: probe tip 51, at least part of which is formed from an electro-optic crystal, and which is brought into close proximity with object being measured 1; first light source 91 which irradiates this electro-optic crystal with light; photodetector element 111 which serves as a displacement detection means which detects the optical displacement of this electro-optic crystal from reflected light from this first light source 91 after it has passed through the aforementioned electro-optic crystal; and electric measuring instrument 60 which serves as a means for measuring the potential of object under test 1 from the results of the displacement detection performed by this photodetector element 111.

The distinguishing features of this device are that probe tip 51 is supported by arm 21, and that there are provided second light source 92 which irradiates probe tip 51 with light; photodetector element 112 and probe position detection circuit 74, which together serve as a position detection means which detects the position of probe tip 51 from light emitted by the second light source 92 and reflected by probe tip 51; and probe position control circuit 75 and probe position controller 96, which together serve as a means for controlling the position of probe tip 51 relative to object being measured 1, and to which are input the results of the detection performed by probe position detection circuit 74.

Next, the working of this fifteenth embodiment of the invention will be explained. Object being measured 1 is set up on piezoelectric element 83, and the measurement site on this object is set in the vicinity of probe tip 51 by operation of probe position controller 96. Scanning is then carried out with probe tip 51 kept in contact with object being measured 1. Light emitted from light source 92 is reflected at probe tip 51 and is then incident upon photodetector element 112. The position at which the reflected light is incident upon photodetector element 112 will be displaced in correspondence with the positional displacement of probe tip 51. Probe position detection circuit 74 measures this displacement and thereby detects the position of probe tip 51. Because this fifteenth embodiment of the invention employs, as a holder for probe tip 51, arm 21 of similar kind to the one used in an atomic force microscope, the mass of the arm is small and the force used on the object being measured is extremely small. There is therefore hardly any chance of physically damaging the test object in the way described in connection with the prior art.

Probe tip 51 scans while detecting irregularities on the surface of object under test 1, and probe position control circuit 75 positions probe tip 51 while making a comparison with a map of the irregularities that has been input beforehand. When the measurement position is decided, light from light source 91 is beamed onto probe tip 51. If an electric potential is present at the measurement site on test object 1, the refractive index of the electro-optic crystal will change due to the electro-optic effect, and the direction of polarization of the light which was emitted from light source 91 and reflected by probe tip 51 will change relative to when no electric potential is present. The amount of change is detected by an optical system comprising wave plate 99, polarizer 97 and photodetector element 111, and is input to electric measuring instrument 60, which results in a measurement of the electric potential at the measurement site. Light source 91 emits pulses of light, and the period of these optical pulses becomes the sampling period of the optical sampling.

Figure 29:
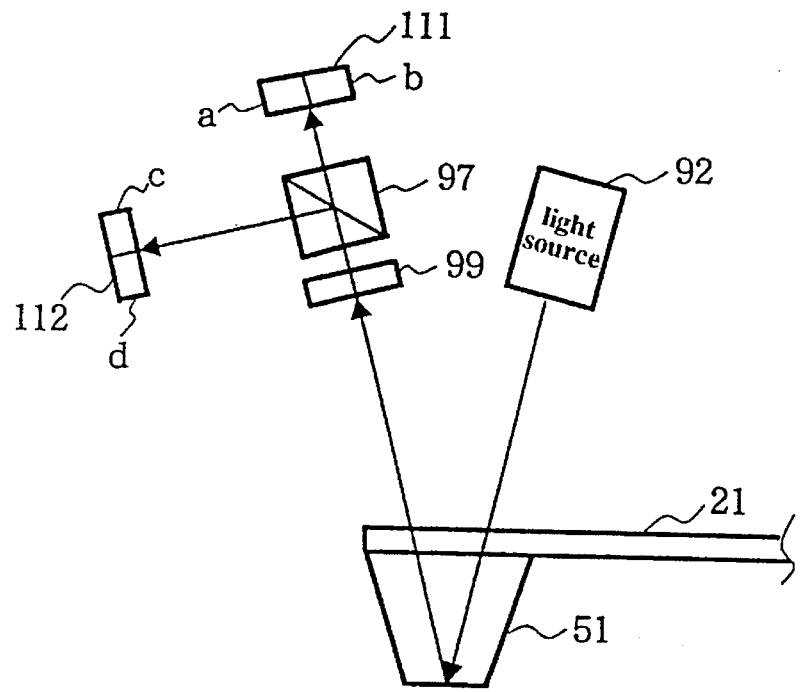
FIG. 29 is a block diagram of a device according to a sixteenth embodiment of this invention.

Next, a sixteenth embodiment of this invention will be explained with reference to FIG. 29, which shows that this sixteenth embodiment differs from the fifteenth embodiment in that detection of the position of probe tip 51 and measurement of the electro-optic effect are performed using a single light source 92. Photodetector elements 111 and 112 are split photodetectors, with photodetector element 111 comprising receiving parts a and b, and photodetector element 112 comprising receiving parts c and d. Using A, B, C and D to represent respectively the receiving levels at receiving parts a, b, c and d, (A+D)–(B+C) will be used for position detection, and (A+B)–(C+D) will be used for the detection of electric potential on object being measured 1. Light source 92 emits pulses of light, and using pulses of light for position detection does not present any practical problems.

Figure 30:
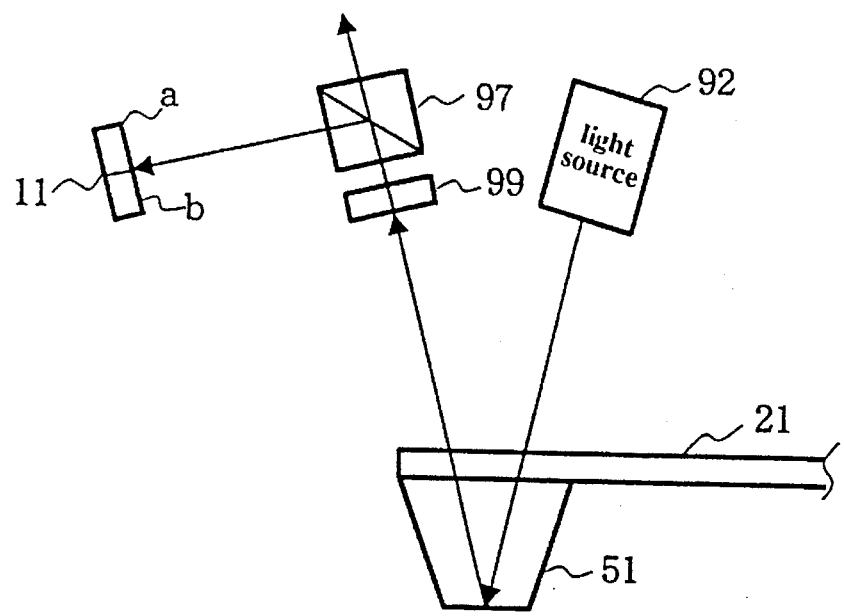
FIG. 30 is a block diagram of a device according to a seventeenth embodiment of this invention.

Next, a seventeenth embodiment of this invention will be explained with reference to FIG. 30, which shows that this seventeenth embodiment differs from the fifteenth embodiment in that a single light source 92 and a single photodetector element 11 are used. Photodetector element 11 is a split photodetector comprising receiving parts a and b, and (A–B) will be used for position detection and (A+B) will be used for the detection of electric potential on object being measured 1.

Figure 31:
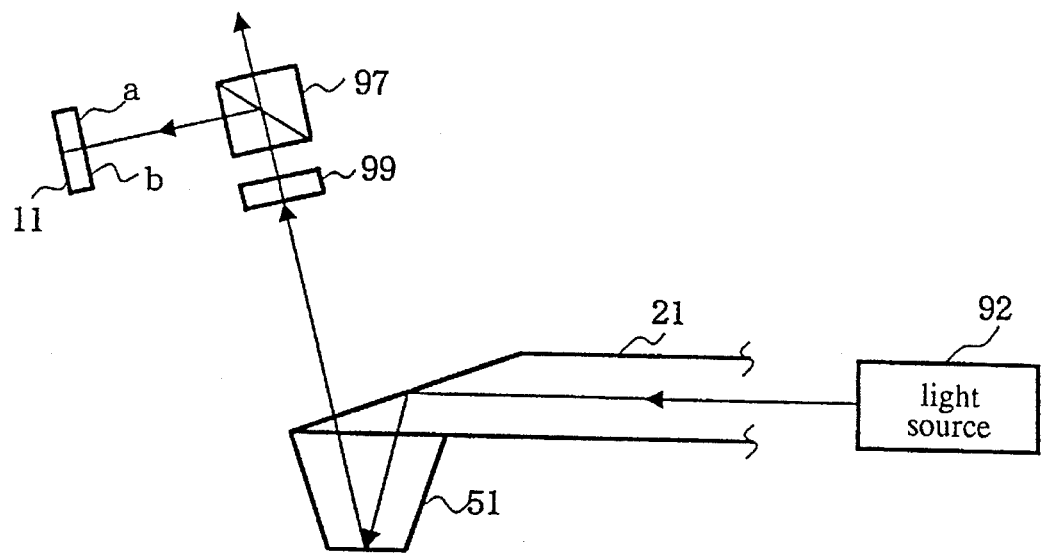
FIG. 31 is a block diagram of a device according to an eighteenth embodiment of this invention.

Next, an eighteenth embodiment of this invention will be explained with reference to FIG. 31, which shows that in this eighteenth embodiment, an optical waveguide is provided in arm 21. Light emitted from light source 92 may be launched directly into the waveguide of arm 21, or it may be launched via an optical fiber. In other words, the advantage of providing a waveguide in arm 21 is that the position at which light source 92 is set up can be freely selected. The measurement principles here are the same as in the seventeenth embodiment, in which a single photodetector 11 was provided.

Figure 32:
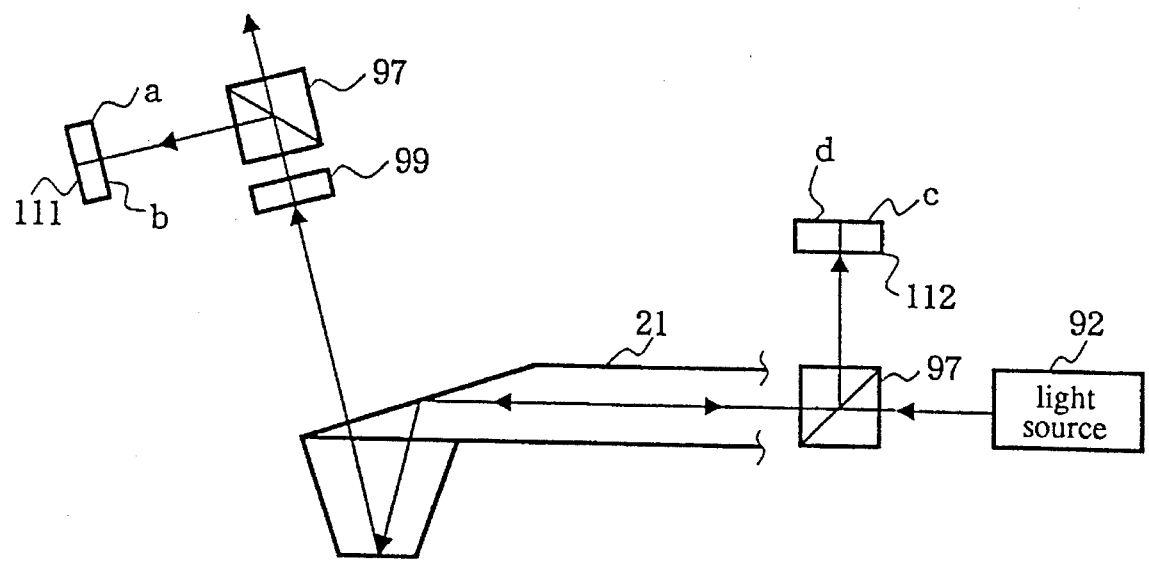
FIG. 32 is a block diagram of a device according to a nineteenth embodiment of this invention.

Next, a nineteenth embodiment of this invention will be explained with reference to FIG. 32, which shows that this nineteenth embodiment is similar to the eighteenth embodiment in that an optical waveguide is provided in arm 21. However, position detection is performed by photodetector element 111 and electric potential detection is performed by photodetector element 112. The measurement principles are the same as in the sixteenth embodiment, but in this nineteenth embodiment of the invention the detection of electric potential is performed using light that has returned through the waveguide.

Figure 33:
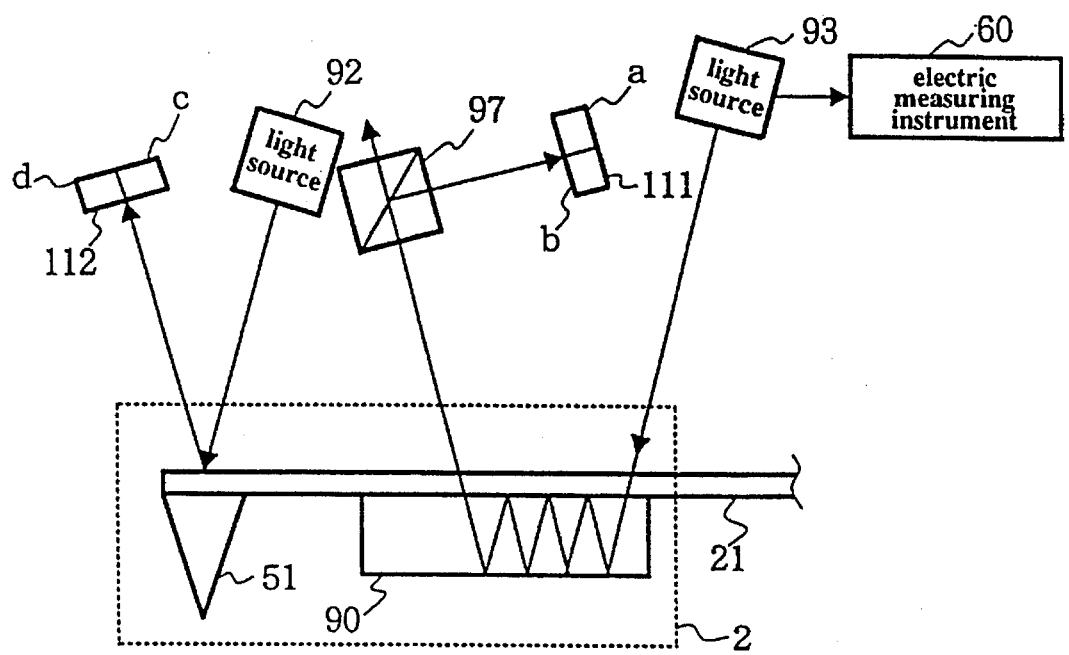
FIG. 33 is a block diagram of a device according to a twentieth embodiment of this invention.

Next, a twentieth embodiment of this invention will be explained with reference to FIG. 33, which is a block diagram of a device according to this twentieth embodiment. The distinguishing feature of this twentieth embodiment is that probe 2 comprises two parts, namely, electro-optic crystal 90 and probe tip 51. Probe tip 51 detects irregularities on object being measured 1. Detection of the position of probe tip 51 is carried out by light source 92 and photodetector element 112. Electro-optic crystal 90 is brought into close proximity with the measurement site on object being measured 1 by means of probe tip 51. Electro-optic crystal 90 produces the electro-optic effect in accordance with the potential at the measurement site. Light from light source 93 reaches photodetector element 111 by way of polarizer 97 after being multiply reflected within electro-optic crystal 90. In other words, minute displacements which cannot be measured by means of a single reflection can be measured by means of multiple reflections. Accordingly, the advantage of this twentieth embodiment of the invention is that it can perform high-sensitivity measurements of electric potential.

Figure 34A:
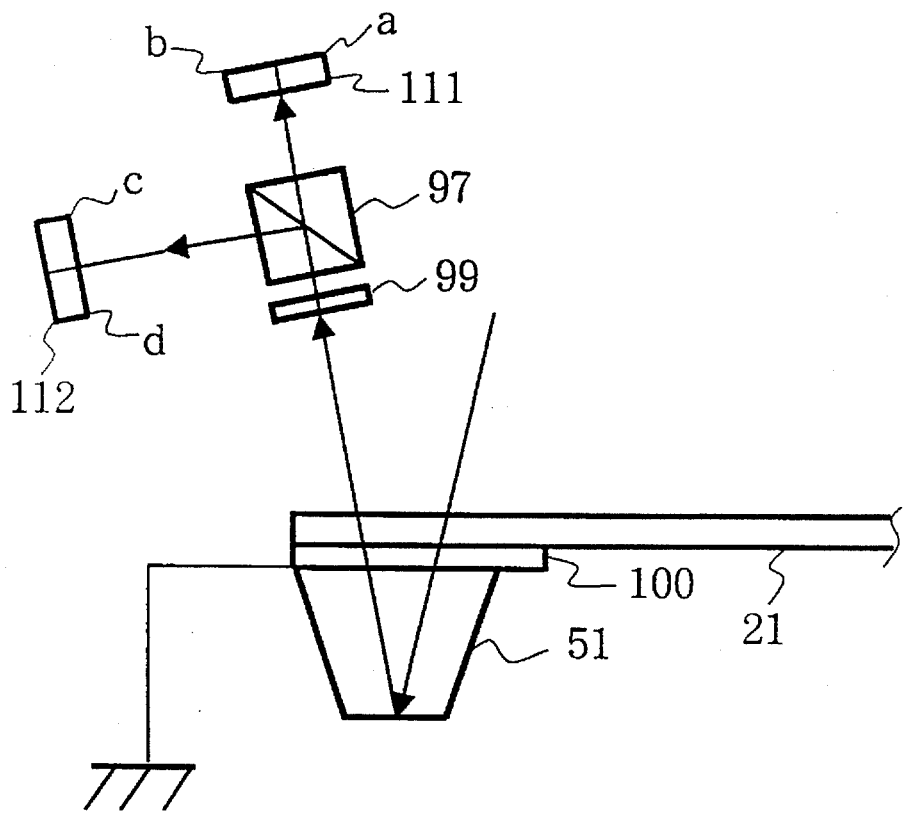
FIGS. 34a and 34b are a block diagrams of a device according to a twenty-first embodiment of this invention.
Figure 34B:
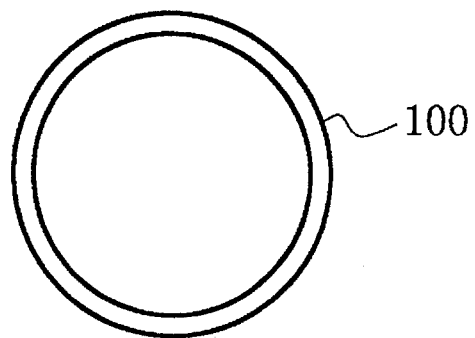
Figure 35:
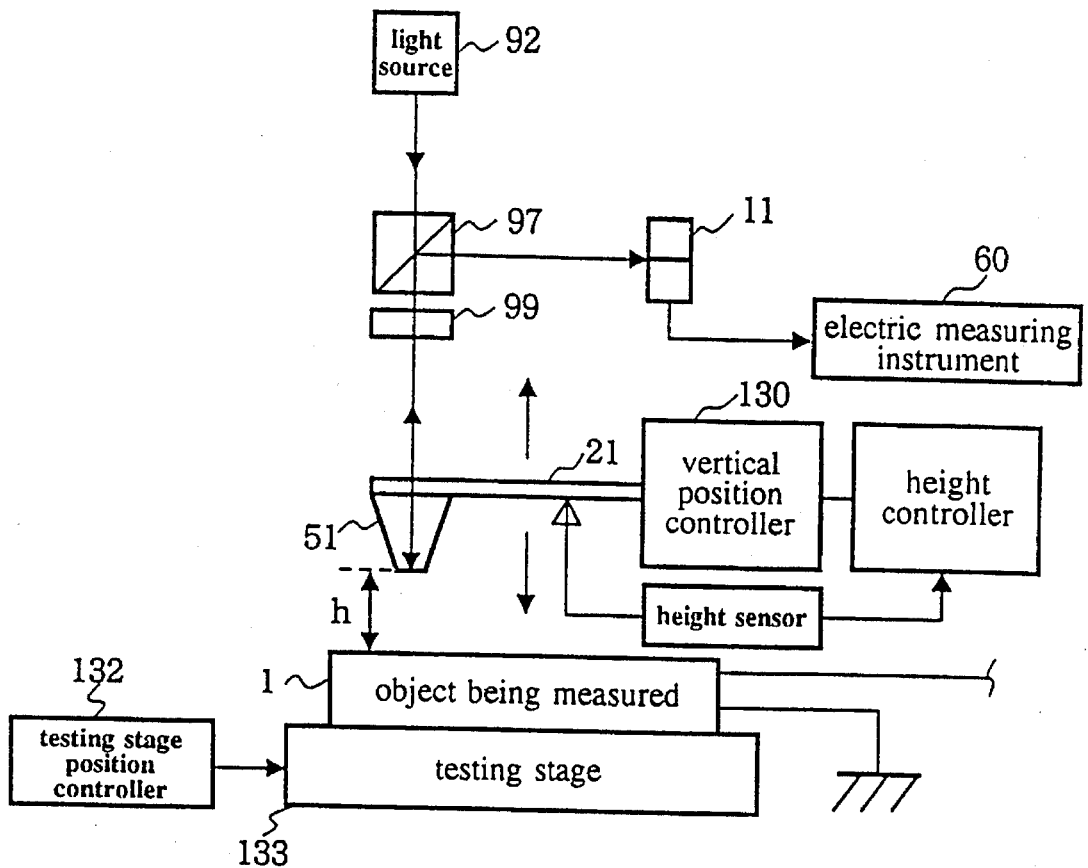
FIG. 35 is a block diagram of a prior art device.

Next, a twenty-first embodiment of this invention will be explained with reference to FIGS. 34a and 3b, which are block diagrams of a device according to this twenty-first embodiment. In this twenty-first embodiment of the invention, as shown in FIG. 34a, ground electrode 100 is provided on probe tip 51. Ground electrode 100 has a hole formed in its middle and is therefore of a shape that does not obstruct the light beam (see FIG. 34b). This enables the absolute value of the electric potential on the test object to be measured. In the fifteenth to the twenty-first embodiments of this invention, all the regions where the light is reflected are treated to form either a mirror or a semitransparent mirror.

As has now been explained, the industrial value of this invention is extremely high, and includes the ability to sample high-speed electric waveforms in real time, which was impossible with methods based on conventional electronic measurement, plus the ability to provide a measuring instrument with extremely good temporal and spatial resolution. The advantages of this method may be listed as follows:

(1) subpicosecond temporal resolution, (2) nanometer spatial resolution, (3) no crosstalk, (4) non-contact measurements can be made, (5) measurements can be made without leading out the signal, (6) because the various microscopy-related functions of STMs, AFMs and the like (e.g., the control functions) can be utilized in this invention without modification, the surface of samples and the position of the probe tip can be monitored with ultrahigh resolution, (7) the absolute value of signal potential can be measured, (8) measurements can be made either in air or in a vacuum.

This invention can also be embodied as a semiconductor integrated circuit which has a measuring electrode connected to a measuring instrument, and wherein an element being measured and the aforementioned measuring electrode are connected by an optically active material. If such an embodiment is applied to an electronic device, a conventional measuring instrument can be used to make the same electrical measurements as those achieved with a device embodying this invention.

This invention meets the need for high temporal and spatial resolution measurement of high-speed electric waveforms at any measurement point on or in an integrated circuit. It is applicable to .faster and more minute objects of measurement, and it provides an inexpensive probe for a faster and more reliable electric measuring instrument. It can also provide an atomic force microscope as a more reliable high-speed electric measuring method and measuring instrument. Because an atomic force microscope according to this invention is constituted so that part of the light used for detecting the probe tip position irradiates an optically active material, it is not necessary to have an extra optical system for making the optically active material conductive. In this way, an inexpensive and highly reliable atomic force microscope can be achieved without disturbing the essential working of an atomic force microscope.

This invention enables an electro-optic measuring instrument capable of performing high-precision position control to be achieved by means of a simple constitution.

We claim:

1. An electro-optically controlled probe measurement system for measuring high speed signals with a low speed measurement instrument, said system comprising:
   a contact probe to be placed within close proximity to an electronic device to be measured, said contact probe comprising:
   an optically active material,
   at least one electrically conductive portion in electrical connection with said optically active material, said at least one electrically conductive portion passing electrical current conducted by said optically active material, and
   a detector for detecting light reflecting from a surface of said contact probe;
   a single light source to provide a single beam of light to said contact probe, a first portion of said single beam of light impinging upon said optically active material to alter a conductive state of said optically active material, and a second portion of said single beam of light reflecting from said surface of said contact probe and impinging upon said detector; and
   probe positioning means to follow an output signal of said detector.

2. An electro-optically controlled probe measurement system for measuring high speed signals with a low speed measurement instrument according to claim 1, said probe positioning means comprising:
   a probe position detection circuit receiving a signal from said detector for detecting a position of said contact probe based on said single beam of light reflecting from said surface of said contact probe; and
   a probe position setting circuit receiving a signal from said probe position detection circuit and setting a position of said contact probe based on said signal from said probe position detection circuit.

3. An electro-optically controlled probe measurement system for measuring high speed signals with a low speed measurement instrument according to claim 1, wherein:
   said optically active material is one of a group IV semiconductor, a group III–V semiconductor, and a group II–VI semiconductor.

4. An electro-optically controlled probe measurement system for measuring high speed signals with a low speed measurement instrument according to claim 1, wherein:
   said optically active material of said contact probe is a probe tip.

5. An electro-optically controlled probe measurement system for measuring high speed signals with a low speed measurement instrument according to claim 4, further comprising:
   a probe mount for mounting said probe tip, said probe mount comprising an optically active material.

6. An electro-optically controlled probe measurement system for measuring high speed signals with a low speed measurement instrument according to claim 5, further comprising:
   an optical waveguide for guiding said beam of light to said optically active material, said optical waveguide being provided along said probe mount.

7. An electro-optically controlled probe measurement system for measuring high speed signals with a low speed measurement instrument according to claim 1, wherein:
   said at least one electrically conductive portion is a probe tip.

8. An electro-optically controlled probe measurement system for measuring high speed signals with a low speed measurement instrument according to claim 1, further comprising:
   a synchronizer circuit for synchronizing a driven frequency of said single light source with a frequency of operation of said electronic device.

9. An electro-optically controlled probe measurement system for measuring high speed signals with a low speed measurement instrument according to claim 8, wherein:
   said synchronizer circuit sets said driven frequency and said frequency of operation of said electronic device to diverge slightly.

10. An electro-optically controlled probe measurement system for measuring high speed signals with a low speed measurement instrument according to claim 1, wherein said contact probe further comprises:
    an optical waveguide for guiding said beam of light to said optically active material.

11. An electro-optically controlled probe measurement system for measuring high speed signals with a low speed measurement instrument according to claim 1, wherein:
    said surface of said contact probe is a semitransparent mirror comprised of at least one of a metal thin film and a dielectric multilayer film.

12. An electro-optically controlled probe measurement system for measuring high speed signals with a low speed measurement instrument according to claim 1, wherein said probe measurement system is applied to an atomic force microscope.

* * * * *